United States Patent
Ooishi

(10) Patent No.: US 6,922,359 B2
(45) Date of Patent: Jul. 26, 2005

(54) NONVOLATILE SEMICONDUCTOR MEMORY DEVICE ALLOWING HIGH SPEED DATA TRANSFER

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 299 days.

(21) Appl. No.: 10/397,265

(22) Filed: Mar. 27, 2003

(65) Prior Publication Data

US 2004/0027857 A1 Feb. 12, 2004

(30) Foreign Application Priority Data

Aug. 7, 2002 (JP) ........................................ 2002-229634

(51) Int. Cl.$^7$ ............................................. G11C 16/10
(52) U.S. Cl. ........................... 365/185.16; 365/185.13; 365/185.11; 365/185.18
(58) Field of Search ........................ 365/185.12, 185.13, 365/185.11, 185.16, 185.18

(56) References Cited

U.S. PATENT DOCUMENTS

| | | | | |
|---|---|---|---|---|
| 4,456,965 A | * | 6/1984 | Graber et al. ............... | 710/100 |
| 5,524,225 A | * | 6/1996 | Kranich ..................... | 711/3 |
| 5,652,861 A | * | 7/1997 | Mayo et al. ................ | 711/157 |
| 6,307,410 B1 | * | 10/2001 | Matsui ...................... | 327/154 |

OTHER PUBLICATIONS

E. Maayan et al., "A 512Mb NROM Flash Data Storage Memory with 8MB/s Data Rate." IEEE International Solid–State Circuits Conference, Feb. 4, 2002, Digest of Technical Papers, pp. 100–101.

* cited by examiner

Primary Examiner—Andrew Q. Tran
(74) Attorney, Agent, or Firm—Burns, Doane, Swecker & Mathis, L.L.P.

(57) ABSTRACT

Local buses for performing writing/reading of data are provided in correspondence to memory blocks each having a plurality of nonvolatile memory cells, and also circuits for performing writing/reading of data are provided in correspondence to the memory blocks. In addition, data transfer lines for bidirectionally transferring data are provided commonly to the memory blocks, and transfer switch gates for performing data transfer between the memory blocks are provided commonly to the memory blocks. The memory blocks are divided into banks, writing/reading of data on individual memory blocks are performed in units of banks, and parallel execution of writing and reading or of writing/reading and internal transfer is performed. Thus, it is possible to improve data transfer processing efficiency in a nonvolatile semiconductor device.

12 Claims, 22 Drawing Sheets

NONVOLATILE SEMICONDUCTOR MEMORY DEVICE ALLOWING HIGH SPEED DATA TRANSFER

BACKGROUND OF THE INVENTION

1. Field of the Invention

The present invention relates to a semiconductor memory device, and particularly to a nonvolatile semiconductor memory device storing data in a nonvolatile manner. More particularly, the present invention relates to a configuration for a data access in a nonvolatile semiconductor memory device with a virtual ground array in which memory cells on adjacent two columns in a row direction are connected to a common bit line.

2. Description of the Background Art

In a nonvolatile semiconductor memory device storing data in a nonvolatile manner, there is known an insulating film charge trap type memory in which charges are trapped in an insulating film under a control gate to store data.

FIG. 25 is a schematic diagram showing a sectional structure of a conventional insulating film charge trap type memory cell. In FIG. 25, an insulating film charge trap type memory cell includes: buried diffusion layers 901a and 901b formed on a surface of a semiconductor substrate region 900; a multilayer insulating film 903 formed on a substrate region between buried diffusion layers 901a and 901b; and a conductive layer 904 formed on multilayer insulating film 903.

Buried diffusion layers 901a and 901b are formed extending in a column direction and used as bit lines. Conductive layer 904 is formed extending in a row direction, used as a word line to transmit a row select signal, and also used as a control gate of the memory cell.

Multilayer insulating film 903 is arranged in parallel to conductive layer 904 extending in a word line direction. Multilayer insulating film 903 has a multilayer structure constructed of an oxide film 903a, a nitride film 903b and an oxide film 903c, and charges are accumulated in a region of nitride film 903b between oxide films 903a and 903c.

In the following description, the term "data programming" is used to indicate an operation of accumulating charges (electrons) in insulating film 903b. In this state, it is assumed that data at H level is written. In storage of L level data, no electron is accumulated. In the insulating charge trap type memory cell, there exist two regions for accumulating charges: a right bit region BT1 and a left bit region BT2.

When programming is performed to right bit region BT1, a voltage of 9 V is applied to control gate (a gate electrode layer) 904 and a voltage of 4.5 to 6 V is applied to diffusion bit line region (an impurity region; buried diffusion region) 901b. Diffusion bit line region (an impurity region; buried diffusion region) 901a is set to a ground voltage level. In this state, a channel is formed on the surface of substrate region 900 in accordance with the voltage applied to gate electrode 904 and a current I flows from diffusion bit line region 901b to diffusion bit line region 901a, as shown with an arrow mark in a left direction in FIG. 25.

Current I flowing in the channel region is accelerated in a vertical direction under an influence of the voltage applied to gate electrode layer 904, and electrons (channel hot electrons) are stored into nitride film 903b and thus accumulated in right bit region BT1. Since a mobility of an electron is small in nitride region 903b, right bit region BT1 is formed only in a region in the vicinity of the drain region in self-alignment with the drain region (since channel hot electrons are generated in a drain high electric field and then accelerated to be accumulated in nitride film 903b).

On the other hand, when electrons are accumulated in left bit region BT2, a voltage of 4.5 to 6 V is applied to diffusion bit line region 901a, and diffusion bit line region 901b is set to ground voltage level. A voltage of 9 V is applied to gate electrode layer 904. In this case, current I flows, as shown with an arrow mark in a right direction in FIG. 25, from diffusion bit line region 901a to diffusion bit line region 901b, and channel hot electrons generated by the drain high electric field is accelerated by the voltage applied to gate electrode 904 to be stored into nitride film 903b. Thereby, electrons are accumulated in left bit region BT2.

In other words, in a programming operation, channel hot electrons (CHE) are generated and trapped in nitride film 903b. A state where electrons are injected in the charge accumulating region is referred to as a programmed state (write state). In the programmed state, electrons are injected into an effective charge accumulating region, which results in a high threshold voltage of a memory cell transistor in this region.

In data reading, current I is caused to flow, as shown with an arrow mark in FIG. 25, in a direction opposite to that in a programming operation. Specifically, when storage data in right bit region BT1 is read out, a voltage of, for example, 1.5 to 2 V is applied to diffusion bit line region 901a and diffusion bit line region 901b is set to ground voltage level. A read voltage of, for example, 4 V is applied to gate electrode layer 904. In this case, a punch-through generates due to widening of a depletion layer in left bit region BT2, and a threshold voltage in a region in the vicinity of left bit region BT2 exerts no influence on a read current. When a current flows from diffusion bit line region 901a to diffusion bit line region 901b in data read operation, a current amount flowing through the channel region is determined according to an electron amount accumulated in right bit region BT1. By detecting the current amount, data stored in right bit region BT1 can be read.

On the other hand, when data stored in right bit region BT2 is read, a voltage of 1.5 to 2 V is applied to diffusion bit line region 901b and diffusion bit line region 901a is set to ground voltage level. A voltage of the order of 4 V is applied to gate electrode layer 904. A punch-through generates in the substrate surface region in the vicinity of right bit region BT1, a depletion layer is merely widened in the right bit region and a current corresponding to an electron amount accumulated in left bit region BT2 flows between diffusion bit lines 901b and 901a. By detecting the current amount, data stored in left region BT2 is read.

Usually, a direction along which a current flows in a memory cell in programming is referred to as a forward direction, and a direction along which a current flows in data reading is referred to as a reverse direction. Therefore, as shown with arrow marks in FIG. 25, a forward direction and a reverse direction in operations for right bit region BT1 are reversed in those for left bit region BT2.

Various erasing methods of storage data have been proposed. One is a method in which a current is caused to flow in a reverse direction to generate channel hot holes to inject the channel hot holes into the nitride film for causing recombination of accumulated electrons with hot holes to neutralize the accumulated electrons. The second is a method in which a voltage is applied between nitride film 903b and gate electrode layer 904 to extract electrons accumulated in nitride film 903b through gate electrode 904. Since gate electrode layer 904 forms a word line as described later and is driven by a row select circuit not shown, electrons is eventually extracted by the row select circuit in the second method.

The third is a method in which a current is caused to flow by a (inter-band) tunneling current between nitride film 903b and the drain region (a diffusion bit line) to extract electrons from nitride film 903b. As to an erasure operation, any of erase operations may be employed. In an erasure operation as well, erasure is individually performed on each of right bit region BT1 and left bit line region BT2.

FIG. 26 is a diagram showing an electrically equivalent circuit of a memory cell and applied voltages in a programming operation. In FIG. 26, there are representatively shown memory cells arranged in two rows and three columns. In FIG. 26, there are shown memory cells MC each formed of a floating gate type transistor. In this insulating film charge trap type memory cell, the floating gate of a floating gate type transistor is formed using not polysilicon, but nitride film (903b).

Word lines WLa and WLb are provided in correspondence to the respective memory cell rows and the gate electrode layers (control gates) of memory cells on a corresponding row are connected to a corresponding word line. Bit lines BLa to BLc are provided in correspondence to memory cell columns. Bit lines BLa to BLc are each shared by memory cells MC adjacent to each other in a row direction.

Now, it is considered a programming operation on right bit region BT1 of memory cell MC1 arranged in correspondence to crossings between word line WLb and bit lines BLb and BLc. Writing (programming) of data is performed by causing a current to flow in a forward direction. Therefore, in this case, a voltage of 4.5 to 6 V is applied onto bit line BLc and bit line BLb is held at ground voltage level. Bit line BLa is maintained in a floating state. Word lines WLa and W1b are set to 0 V and 9 V, respectively. In this state, in memory cell MC, a current flows from bit line BLc to bit line BLb to generate channel hot electrons, e and generated electrons are stored in right bit region BT1.

In a memory cell MC3 adjacent to memory cell MC1 in a row direction, since bit line BLa is in a floating state and no channel current flows, no channel hot electron is generated, and programming is not performed.

In memory cell MC3 adjacent to memory cell MC1 in a column direction, since word line WLa is maintained at ground voltage level to hold the memory cell transistor in a non-conductive state, no channel current flows, and programming is not performed.

Therefore, even in a configuration in which a bit line is shared by memory cells adjacent to each other in a row direction, programming can be correctly performed only in a memory cell of a programming object.

FIG. 27 is a diagram showing applied voltages in data reading. In FIG. 27, when data stored in right bit region BT1 of memory cell MC1 is read out, a voltage of 1.5 to 2 V is applied onto bit line BLb, and bit line BLc is maintained at ground voltage level. Word lines WLa and WLb are set to 0 V and 4 V, respectively. In this state, current I corresponding to an amount of electrons accumulated in right bit region BT1 of memory cell MC1 flows from bit line BLb to bit line BLc. A magnitude of current I is detected to read data stored in right bit region BT1. In a read operation, bit line BLa is in a floating state and even if read voltage of 1.5 to 2 V is applied onto bit line BLb in memory cell MC2, no current flows in memory cell MC2. Therefore, current I of a magnitude corresponding to data stored in right bit region BT1 of memory cell MC1 can be caused to flow correctly.

When data in left bit region BT2 of memory cell MC1 is read, a voltage of 1.5 to 2 V is applied onto bit line BLc and ground voltage is applied to bit line BLb. In this case, a bit line on the right side of bit line BLc is maintained in a floating state.

FIG. 28 is a schematic diagram showing a configuration of a data read section of a conventional nonvolatile semiconductor device. In FIG. 28, the data read section includes: a constant current source 920 coupled to a bit line BL corresponding to a selected column through a column select gate 915, and supplying a read voltage together with a constant current IR to selected bit line BL; a capacitive element 921 charged by a shunt current Is from constant current source 920; and an amplifying circuit 922 generating internal read data RT in accordance with a charged voltage of capacitive element 921. Amplifying circuit 922 is formed of, for example, a differentially amplifying circuit and compares the charged voltage of capacitive element 921 with a prescribed reference voltage to generate binary read data RD.

Bit line BL is connected to a virtual source line VSL through memory cell MC. Virtual source line VSL is formed of a bit line BL on an adjacent column and in data reading, virtual source line VSL is maintained at ground voltage level. A column select signal on column select line CSL is applied to column select gate 915.

In the configuration of the internal data read section shown in FIG. 28, a value of the shunt current Is supplied to capacitive element 912 is different according to a magnitude of current Ib flowing into virtual source line VSL from bit line BL, and therefore, changes according to storage data in memory cell MC. Therefore, a charged voltage of capacitive element 921 in a prescribed period is different according to storage data in memory cell MC. By detecting and amplifying the charged voltage of capacitive element 921 with amplifying circuit 922, internal read data RD is generated.

Capacitive element 921 is once discharged to ground voltage level through a discharging switch not shown prior to data reading.

In a configuration in which a bit line is shared by adjacent memory cells as described above, a bit line is used as a virtual source line according to a selected memory in a program mode and a data read mode, and maintained at ground voltage level. Such an array configuration is referred to as a "virtual GND (ground) array" configuration.

In such a virtual GND array configuration, since a bit line is shared by two memory cells adjacent to each other in a row direction, a bit line in a floating state and a bit line in a ground voltage state are arranged on opposite sides with respect to a bit line receiving a program high voltage in programming. Therefore, a possibility arises that a current flowing in a bit line connecting to a memory cell of a programming object flows into a bit line in a floating state through an adjacent memory cell. In such a case, an amount of electrons injected into the insulating film (nitride film) of the memory cell of interest becomes insufficient, thereby impeding correct programming of data.

While it can be considered that a programming period is extended for reliable programming, current flows in a bit line in a floating state in this case, which would increase current consumption.

In data reading as well, likewise, a bit line at a ground voltage level and a bit line in a floating state are arranged on opposite sides with respect to a bit line receiving a read voltage. Therefore, in this state as well, a possibility arises that a current flows from a bit line connecting to a memory cell of a reading object to a bit line in a floating state. If storage data in the memory cell of interest is data corresponding to a programmed (write) state, a possibility arises that a erroneous determination is made that the memory cell is in an erased state, to impede a correct data reading.

Since a bit line of a programming/reading object is shared by memory cells adjacent to each other in a row direction, bit lines at a ground voltage level and in a floating state, respectively, are arranged oppositely with respect to the bit line of a programming/reading object. Therefore, in one memory block, programming/data reading can be performed only on one memory cell, thereby impeding high-speed data writing/reading. There arises a problem that a processing system efficiently performing a processing is difficult because of a small read data bit width and accordingly a small data band width.

In programming, an external access is prohibited and a voltage necessary for writing of data is generated internally to perform writing. Charges need to be injected into an insulating film in programming and a cycle time for data writing is longer than a cycle time for data reading. Therefore, a cycle time for data writing determines an access time of the semiconductor memory device, which impedes a high speed access.

SUMMARY OF THE INVENTION

It is an object of the present invention to provide a semiconductor memory device capable of efficiently performing writing and reading of data.

It is another object of the present invention to provide a semiconductor memory device excellent in data transfer efficiency.

It is still another object of the present invention to provide a nonvolatile semiconductor memory device capable of configuring a processing system excellent in data processing efficiency.

A semiconductor memory device according to a first aspect of the present invention includes: a plurality of memory blocks each having a plurality of nonvolatile memory cells; a plurality of local buses, provided in correspondence to the respective memory blocks, each transmitting a voltage necessary for performing writing and reading of data on a corresponding memory block; and a data transfer bus commonly provided to the plurality of memory blocks to perform data transfer between selected memory blocks of the plurality of memory blocks.

A semiconductor memory device according to a second aspect of the present invention includes a plurality of memory blocks. Each of the memory blocks includes: a plurality of nonvolatile memory cells arranged in rows and columns; a plurality of bit lines provided in correspondence to the memory cell columns, each arranged being shared by memory cells on columns adjacent to each other, and each connecting to nonvolatile memory cells on a corresponding column; and a plurality of word lines provided in correspondence to respective memory cell rows, and each connecting to nonvolatile memory cells on a corresponding row.

The semiconductor memory device according to the second aspect of the present invention further includes: a plurality of local buses provided in correspondence to the respective memory blocks; a plurality of voltage supply control circuits provided in correspondence to the respective memory blocks, each operating individually on a memory block basis, and in operation, each setting a voltage on a corresponding local bus according to at least an address signal, an operation mode instruction signal and write data when data writing is instructed by the operation mode instruction signal; a plurality of internal read circuits provided in correspondence to the respective memory blocks) each operating individually on a memory block basis, each detecting data on a selected signal line of a local data bus in accordance with at least an address signal in operation of generating internal read data; and a plurality of bit line select circuits provided in correspondence to the memory blocks, each operating individually on a memory block basis, and in operation, each coupling a signal line of a corresponding local bus to a bit line of a corresponding memory block in accordance with an address signal.

A local bus is provided in correspondence to a memory block and a data transfer bus is commonly provided to a plurality of memory blocks. Therefore, when data writing or data reading is performed on one memory block, data to which an access is made can be transferred to another block through the data transfer bus, thereby allowing saving and back-up of data with ease. Furthermore, where a bank configuration is employed, by performing data transfer between banks, and by reading transfer data from one bank while writing is performed to another bank, a processing efficiency can be improved.

Furthermore, by performing data writing/reading individually in each of the plurality of memory blocks, data writing and reading can be simultaneously performed in memory blocks, a data bit width can be widened, and a band width of transfer data can be expanded, thereby improving a processing efficiency.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
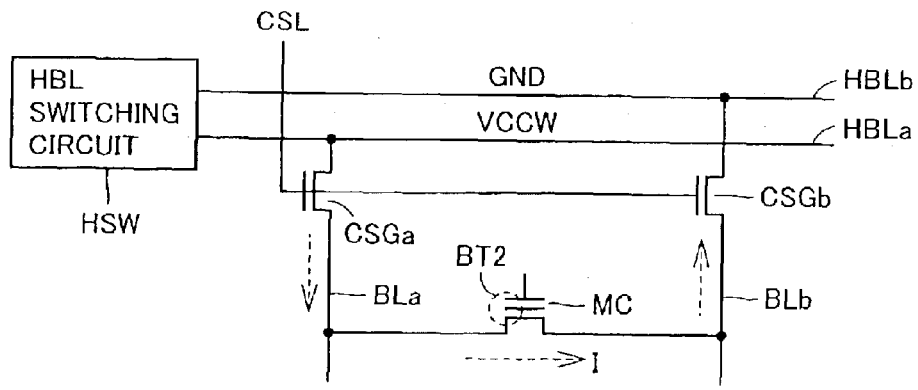
FIG. 1 is a diagram showing a current flow in programming on a memory cell in the present invention.

FIG. 1 is a schematic diagram showing a fundamental configuration of a main part of a nonvolatile semiconductor memory device according to the present invention. In FIG. 1, potential supply lines HBLa and HBLb are commonly disposed to bit lines arranged in one memory block. Voltage levels of potential supply lines HBLa and HBLb are set by HBL switching circuit HSW. HBL switching circuit HSW sets the voltage levels on potential supply lines HBLa and HBLb in accordance with an address signal, a write/read instruction signal, a reverse/forward direction instruction signal and write data.

While the number of potential supply lines HBL is arbitrary, in order to simplify the description, it is assumed that two potential supply lines are included in potential supply bus HB. Potential supply bus HB is provided for each memory block. Detailed description will be given of arrangement of potential supply buses HB.

In a memory block provided in correspondence to potential supply line HBLa and HBLb, nonvolatile memory cells MC are arranged in rows and columns. In FIG. 1, there is representatively shown a memory cell MC connected between bit lines BLa and BLb. Memory cell MC is an insulating film charge trap type memory cell and has two storage regions (charge accumulating regions): right bit region BT1 and left bit region BT2. In FIG. 1, there is shown left bit region BT2.

Bit lines BLa and BLb are coupled to respective potential supply lines HBLa and HBLb in accordance with a column select signal on a column select line CSL. With a prescribed number of bit lines being a set, bit lines in each set are coupled to different potential supply lines at the same time. HBL switching circuit HSW determines and sets only the voltage levels on potential supply lines HBLa and HBLb, and is not required for controlling each of the voltages on the respective bit lines, which facilitates voltage control in writing/reading.

In FIG. 1, there is shown a flow of current I in programming on left bit region BT2 of memory cell MC. In a program operation on left bit region BT2 of memory cell MC, read high potential VCCW and ground potential GND are applied to potential supply lines HBLa and HBLb, respectively. Column select gates CSGa and CSGb are rendered conductive in accordance with column select signal SCL to couple bit lines BLa and BLb to potential supply lines HBLa and HBLb respectively. In this state, current I flows from potential supply line HBLa to potential supply line HLBb through bit line BLa, memory cell MC and bit line BLb. Therefore, in memory cell MC, channel hot electrons are accumulated in left bit region BT2 and accordingly, programming is performed. Thereby, H level data is stored in left bit region BT2. When L level data is stored, a storage region is maintained in an erased state.

Figure 2:
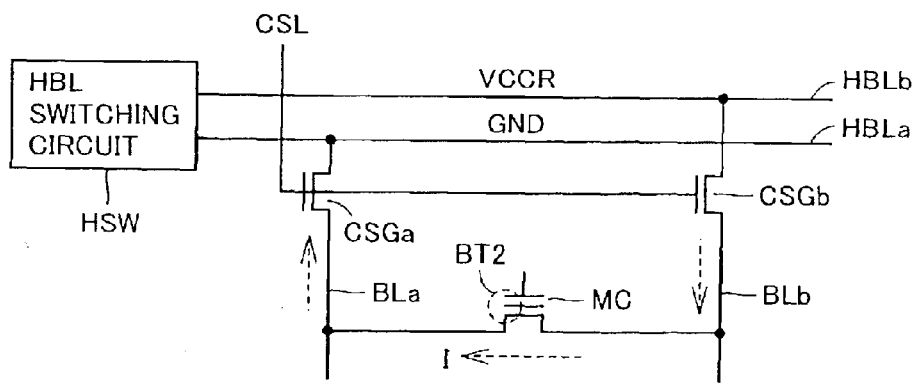
FIG. 2 is a diagram showing a current flow in data reading on a memory cell in the present invention.

FIG. 2 is a diagram showing a flow of current I in reading storage data in left bit region BT2 of memory cell MC. When a storage data in left bit region BT2 is read out, HBL switching circuit HSW supplies ground voltage GND and read voltage VCCR to potential supply lines HBLa and HBLb, respectively. Column select gates CSGa and CSGb are rendered conductive in accordance with a column select signal on column select line CSL.

In this state, current I is supplied from potential supply line HBLb to memory cell MC through bit line BLb, and a current corresponding to data stored in left bit region BT2 of memory cell MC flows into potential supply line HBLa through bit line BLa. In data reading, a current amount flowing through potential supply line HBLb receiving read voltage VCCR is detected by a sense amplifier not shown. Connection of the sense amplifier with potential supply line HBLb is performed by HBL switching circuit HSW. Current I is on the order of tens of $\mu$A in a read operation.

Figure 3:
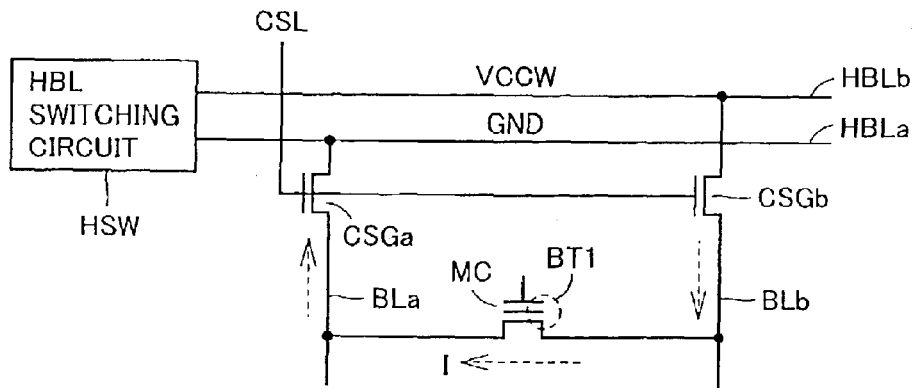
FIG. 3 is a diagram showing a current flow in programming in a different region of a memory cell in the present invention.

FIG. 3 is a diagram showing a flow of current I in programming on right bit region BT1 of memory cell MC. In programming of right bit region BT1, potential supply lines HBLa and HBLb are set to ground potential GND and write high potential VCCW, respectively. In this state, current I is supplied from potential supply line HBLb to memory cell MC through bit line BLb, and current I flows into potential supply line HBLa through bit line BLa. Therefore, hot electrons are generated by a channel current in memory cell MC and accumulated in right bit region BT1.

Figure 4:
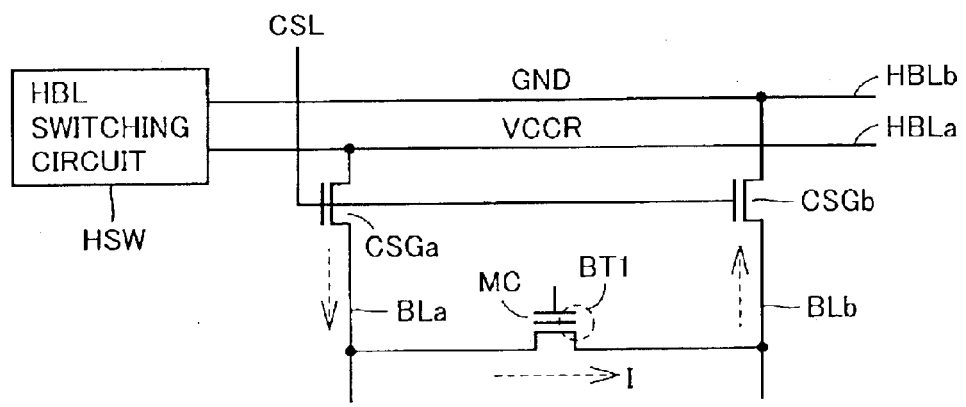
FIG. 4 is a diagram showing a current flow in data reading in a different region of a memory cell in the present invention.

FIG. 4 is a diagram showing a current I flow in reading of storage data in right bit region BT1 of memory cell MC. In reading of storage data in right bit region BT1 of memory cell MC, potential supply lines HBLa and HBLb are set to read voltage VCCR and ground voltage GND, respectively. In this state, in right bit region BT1 of memory cell MC, current I flows in a reverse direction to cause a current corresponding to storage data in right bit region BT1 to flow into potential supply line HBLb. A current flowing through potential supply line HBLa is detected by a sense amplifier not shown to detect storage data in right bit region BT1 of memory cell MC.

By setting the voltage levels on potential supply lines HBLa and HBLb with HBL switching circuit HSW according to a location of a selected memory cell and an operation mode, the number of components can be reduced as compared with a configuration of switching a connecting potential supply node for each of bit lines BLa and BLb according to an operation mode since there is no necessity for providing switching transistors for switching the connecting potential nodes for each bit line.

Figure 5:
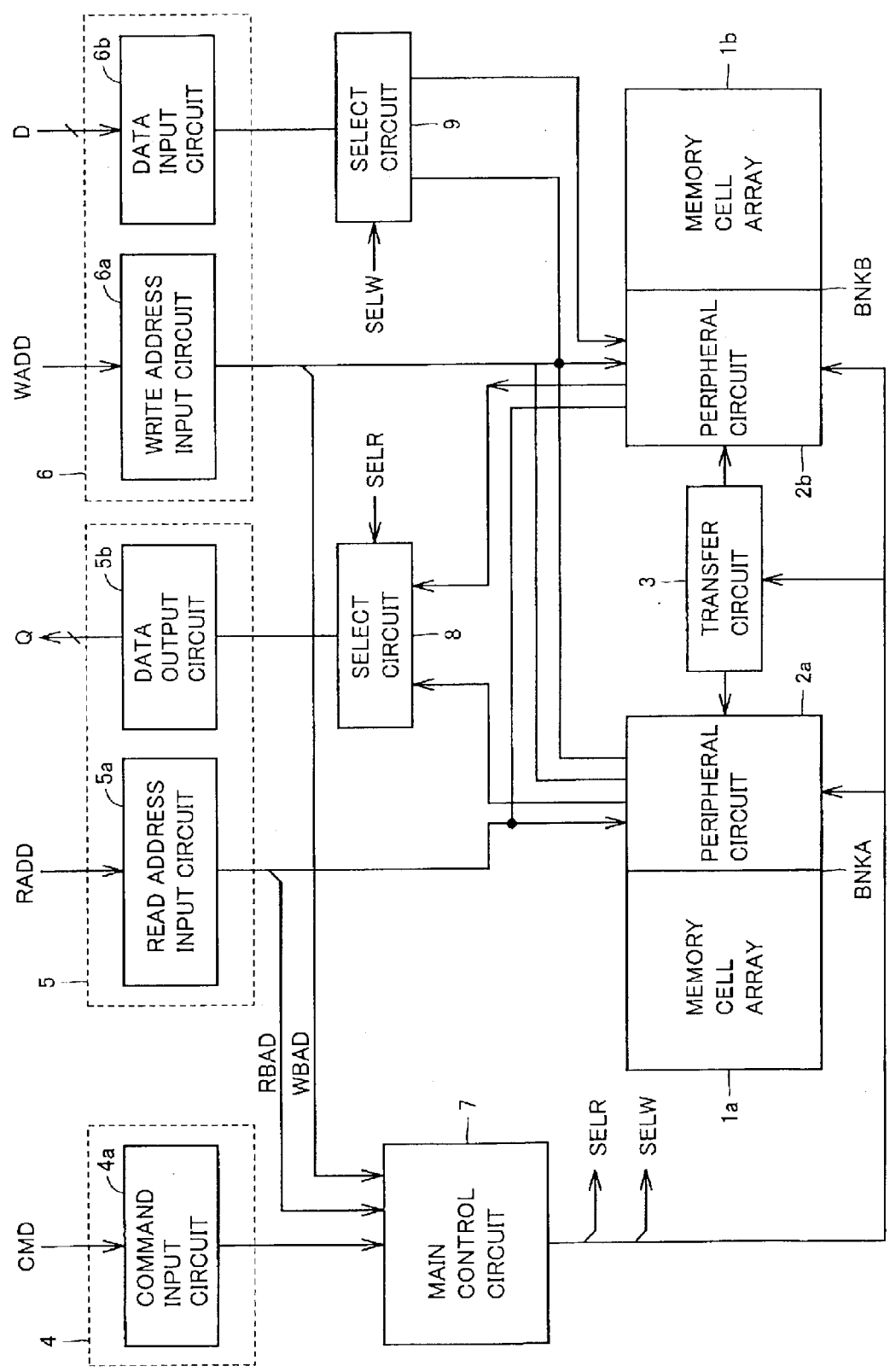
FIG. 5 is a schematic diagram showing an overall configuration of a semiconductor memory device according to a first embodiment of the present invention.

FIG. 5 is a schematic diagram showing an overall configuration of a semiconductor memory device according to a first embodiment of the present invention. In the nonvolatile semiconductor memory device shown in FIG. 5, there are provided two banks BNKA and BNKB. Bank BNKA includes a memory cell array 1a and a peripheral circuit 2a, and bank BNKB includes a memory cell array 1b and a peripheral circuit 2b. In each of memory cell arrays 1a and 1b, nonvolatile memory cells are arranged in rows and columns.

Each of peripheral circuits 2a and 2b includes: a row select circuit for selecting a memory cell row; a column select circuit for selecting a memory cell column (bit line); an HBL switching circuit for generating voltages necessary for writing/reading of data; and a sense amplifier performing reading of data.

A transfer circuit 3 is provided between banks BNKA and BNKB for performing bidirectional transfer of data between banks BNKA and BNKB. When a data access (writing/reading) to one bank of banks BNKA and BNKB is performed, transfer circuit 3 transfers data of the one bank to the other bank. Alternatively, data is simply transferred internally from one bank to the other bank.

The nonvolatile semiconductor memory device further includes: a command port 4 receiving a command CMD instructing an operation mode externally supplied; a read port 5 receiving a read address RADD and outputting external data Q; and a write port 6 receiving a write address RADD and write data D.

Command port 4 includes a command input circuit 4a receiving an external command CMD. A circuit configuration of command input circuit 4a is determined according to a construction of command CMD. For example, when command CMD is constructed of a plurality of signals, command input circuit 4a includes a decode circuit for decoding a supplied command and generating an internal operation mode instruction signal according to a result of the decoding. When command CMD is constructed to instruct an operation mode by one signal, command input circuit 4a is formed of a buffer circuit.

Read port 5 includes: a read address input circuit 5a receiving a read address RADD applied externally to generate an internal read address including an internal read bank address signal RBAD; and a data output circuit 5b buffering and externally output data read from a selected bank to output the data. Data Q outputted externally is constituted of a plurality of bits.

Write port 6 includes: a write address input circuit 6a receiving a write address signal WADD externally applied to generate an internal write address signal including an internal right bank address WBAD; and a data input circuit 6b receiving write data D externally supplied to generate an internal write data.

By separately providing read port 5 and write port 6, data writing is performed to one bank and in parallel to the data writing, reading of data is performed on another bank. In data writing requiring a relatively long period of time, data access efficiency is improved by making an access to another bank to read data.

In order to control internal operations in the nonvolatile semiconductor memory device, there are provided: a main control circuit 7 receiving an internal command (an operation mode instruction signal) from command input circuit 4a, a read bank address signal BRAD from read port 5 and a write bank address signal WBAD from write port 6; a select circuit 8 for selecting one of data read from banks BNKA and BNKB in accordance with a select signal SELR from main control circuit 7; and a select circuit 9 for transmitting data received from write port 6 to one of banks BNKA and BNKB in accordance with select signal SELW from main control circuit 7.

Internal address signals from read port 5 and write port 6 are applied to both banks BNKA and BNKB. Main control circuit 7 activates a selected bank in accordance with an internal operation mode instruction signal applied through command port 4 to an addressed bank in accordance with bank address signals RBAD and WBAD.

Figure 6:
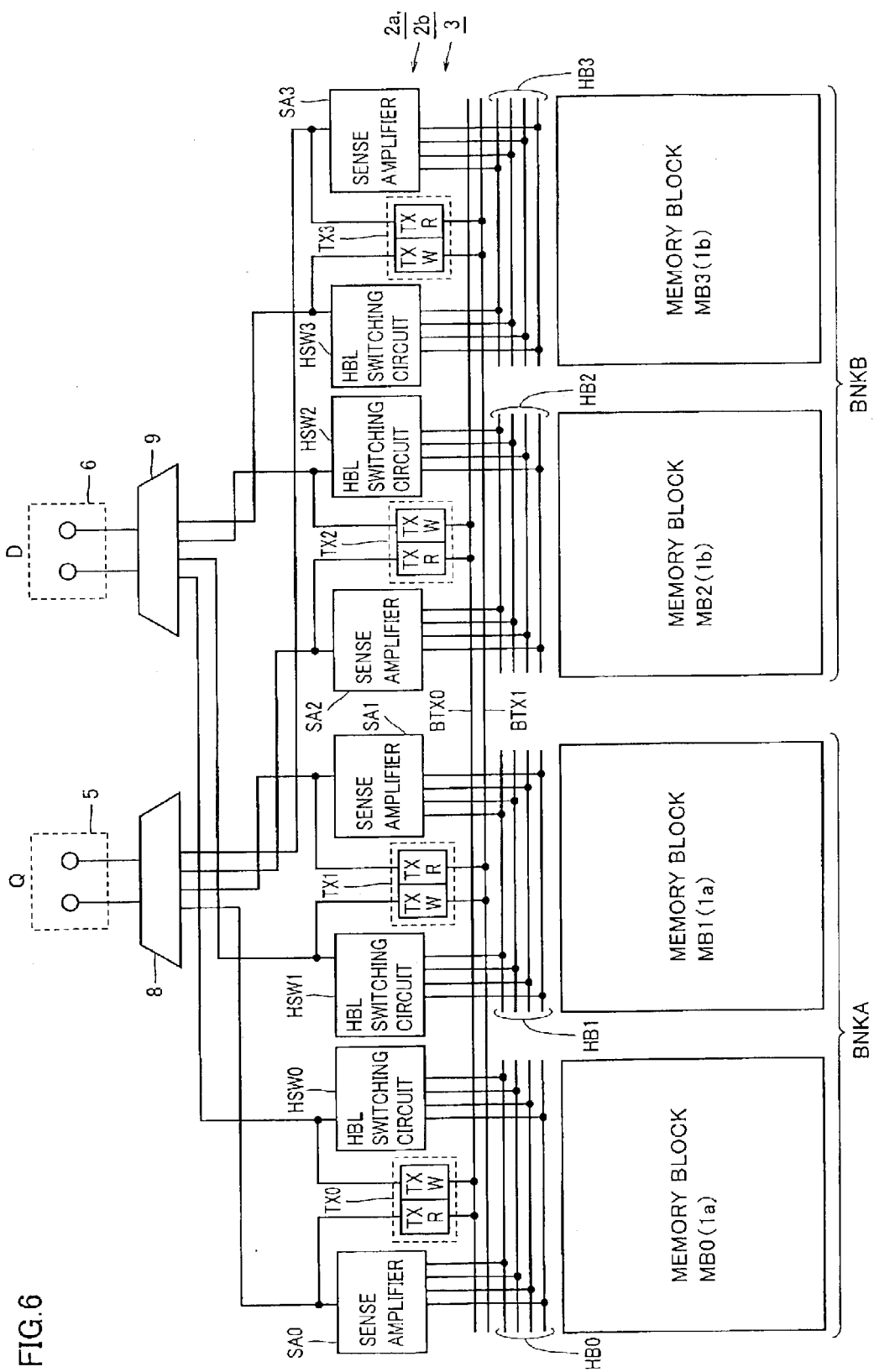
FIG. 6 is a schematic diagram showing a configuration of a main part of the semiconductor memory device according to the first embodiment of the present invention.

FIG. 6 is a diagram showing an example of a configuration of banks BNKA and BNKB shown in FIG. 5. In FIG. 6, a memory array 1a of bank BNKA includes two memory blocks MB0 and MB1, and a memory array 1b of bank BNKB includes memory blocks MB2 and MB3. In each of memory blocks MB0 and MB1, one memory cell is selected. In each of memory blocks MB2 and MB3, one memory cell is selected. Therefore, in the configuration shown in FIG. 6, writing/reading of 2-bit data is performed on a selected bank.

Potential supply buses HB0 to HB3 are provided in correspondence to memory blocks MB0 to MB3, respectively. HBL switching circuits HSW0 to HSW3 are provided in correspondence to potential supply buses HB0 to HB3, respectively. HBL switching circuits HSW0 to HSW1 are shown being arranged adjacently to each other, while HBL switching circuits HSW2 and HSW3 are shown being arranged adjacently to each other. Potential supply circuits HSW0 and HSW1 are arranged at the opposing sides of memory blocks MB0 and MB1, so that currents flow in opposite directions in memory blocks MB0 and MB1. This also applies to potential supply circuits HSW2 and HSW3.

HBL switching circuits HSW0 to HSW3 are all coupled to select circuit 9. In data writing, HBL switching circuits HSW0 to HSW3 set the voltage levels of corresponding potential supply buses HB0 to HB3 according write data. A read address and a write address from read port 5 and write port 6 are applied to HBL switching circuit HSW0 to HSW3, and control signals from main control circuit 7 are applied to the switching circuits HSW0 to HSW3.

Sense amplifiers SA0 to SA3 are provided in correspondence to potential supply buses HB0 to HB3, respectively. Sense amplifiers SA0 to SA3 are coupled, in data reading, to potential supply lines supplied with read voltages on corresponding potential supply buses HB0 to HB3 and generate internal read data in accordance with current amounts. Sense amplifiers SA0 to SA3 are coupled to select circuit 8.

Connection between sense amplifiers SA0 to SA3 and potential supply lines of potential supply buses HB0 to HB3 is selectively made in accordance output signals of decoders included in potential supply circuits HSW0 to HSW3.

As transfer circuit 3 shown in FIG. 5, bidirectional transfer lines BTX0 and BTX1 are commonly provided to memory blocks MB0 to MB3. Bidirectional data transfer line BTX0 is coupled to a transfer switch circuit TX0 provided in correspondence to memory block MB0 and to a transfer switch circuit TX2 provided in correspondence to memory block MB2. Bidirectional data transfer line BTX1 is coupled to transfer switch circuits TX1 and TX3 provided in correspondence to memory blocks MB1 and MB3, respectively.

Each of transfer switch circuits TX0 to TX3 includes: a read switch TXR connected to a corresponding sense amplifier; and a write transfer switch TXW coupled to a corresponding HBL switching circuit.

In a write operation, input data D of multi-bits is distributed to a selected bank and written to memory blocks of the selected bank in parallel. In a data read operation, data read from a memory block of a selected bank is selected by select circuit 8 and outputted.

As shown in FIG. 5, read port 5 and write port 6, to which read address RADD and write address WADD are applied respectively, are separately provided and a read access is made to one bank while writing is performed to another bank, thereby improving an operating efficiency. This is because in data writing, electrons are injected into right bit region BT1 or left bit region BT2, and a longer period of time is required than in data reading. Accordingly, during a write operation, by performing a data read operation in another bank, data can be efficiently transferred to an external processing device.

HBL switching circuits HSW0 to HSW3 are provided in correspondence to respective memory blocks MB0 to MB3 for the following reasons. Memory blocks MB0 to MB3 have a virtual GRD array configuration and each bit line is shared by memory cells adjacent to each other in a row direction. Therefore, a bit line can be a drain line or a source line in accordance with an address of a selected memory cell. It is required to control connection of a sense amplifier to a bit line and potential on a bit line according to whether a bit line serves as a source line or a drain line. Furthermore, in writing, control of a bit line potential is different depending on programming or non-programming. By connecting bit lines with sense amplifiers and setting supply voltages on bit lines on a memory block basis, correct writing/reading of data can be performed in units of memory blocks.

Figure 7:
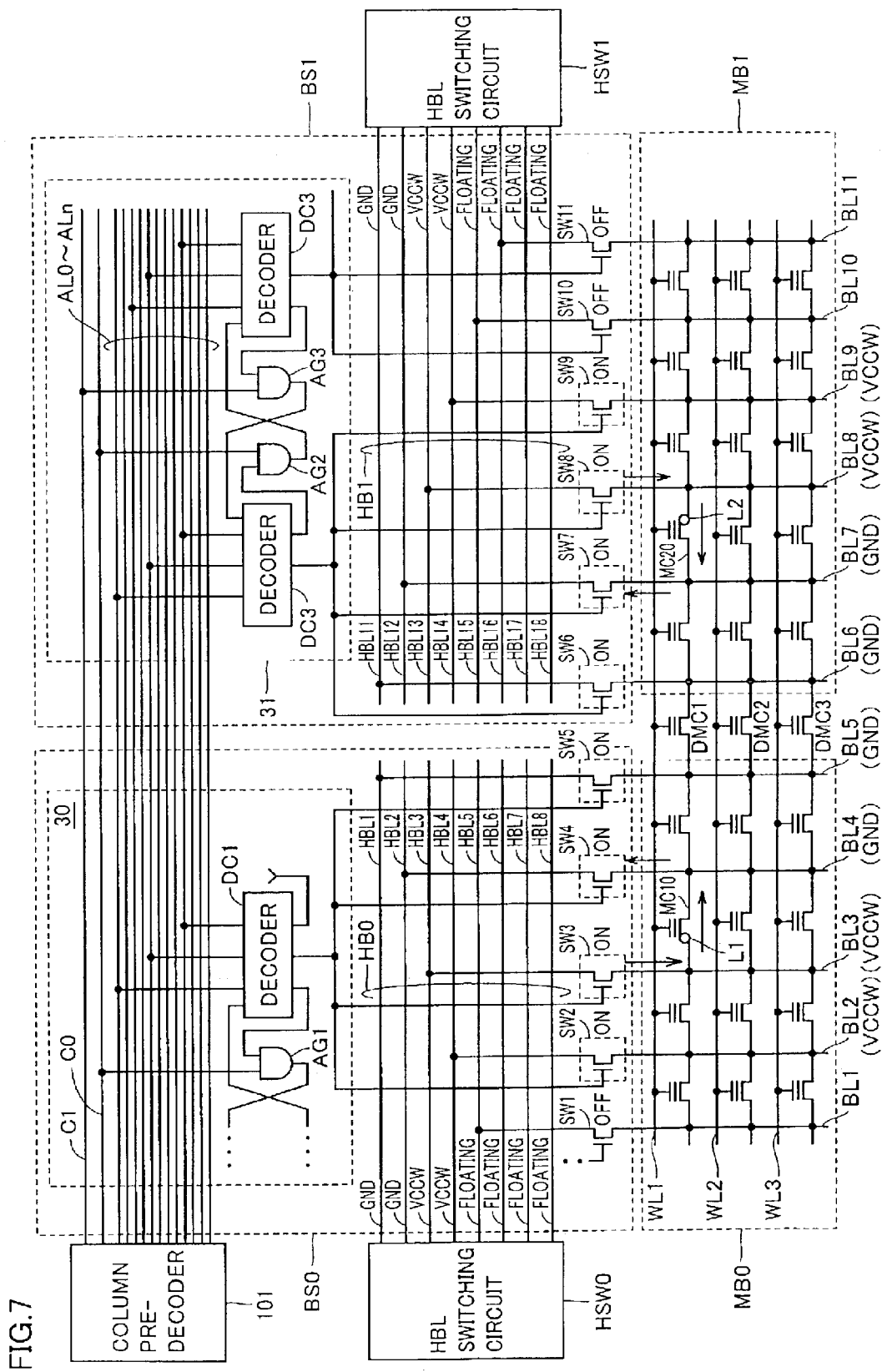
FIG. 7 is a diagram showing a memory block and peripheral circuitry shown in FIG. 6 in more detail.

FIG. 7 is a specific diagram showing configurations of memory blocks MB0 and MB1 and peripheral circuitry shown in FIG. 6. In FIG. 7, in memory block MB0, a plurality of memory cells MC are arranged in rows and columns. In memory block MB1, a plurality of non-volatile memory cells MC are also arranged in rows and columns. In FIG. 7, there are representatively shown, as a part of memory block MB0, nonvolatile memory cells MC are arranged in three rows and four columns and, as a part of a memory block MB1, nonvolatile memory cells (hereinafter, simply referred to as memory cell) are arranged in three rows and five columns.

In memory block MB0, bit lines BL1 to BL5 are provided in correspondence to memory cell columns so as to be shared by memory cells on adjacent columns. In memory block MB1, bit lines BL6 to BL11 are provided in correspondence to memory cell columns so as to be shared by memory cells on adjacent columns. In a boundary region between memory blocks MB0 and MB1, dummy cells are arranged and representatively, dummy cells DMC1, DMC2 and DMC3 are disposed in correspondence to each of memory cell rows. Dummy cell DMC (genericly refers to the dummy cells) is used as an isolation element for avoiding a conflict between bit line voltages of respective memory blocks and for preventing flowing-in/flowing-out of a current between the memory blocks when an access is made to a memory cell in a boundary region of memory blocks MB0 and MB1.

Word lines WL1 to WL3 are provided in correspondence to respective memory cell rows in memory blocks MB0 and MB1.

Bit line select circuits BS0 and BS1 are provided in correspondence to memory blocks MB0 and MB1, respectively. Each of bit line select circuits BS0 and BS1 includes: column select switches SW provided corresponding to bit lines BL and connecting respective bit lines to predetermined potential supply lines HBL when selected; and a switch control circuit 30 controlling a conduction/a non-conduction of the column select switches SW.

Switch control circuit 30 includes: decoders DC each for simultaneously selecting four bit lines in accordance with predecode signals AL0 to ALn from column predecoder 101; and AND gates AG selectively activating an adjacent decoder in accordance with signals C0 and C1 indicating a location of a selected memory cell.

Four column select switches SW are provided to one decoder DC. With the column select switches, a maximum total of eight selected bit lines are coupled to potential supply lines of potential supply bus HB in a one to one correspondence in accordance with output signals of decoders DC.

In switch control circuit 30 included in bit line select circuit BS0 shown in FIG. 7, there are representatively shown a decoder DC1, and an AND gate AG1 receiving an output signal of decoder DC1 and a memory cell location indication signal C0. AND gate AG1 activates a decoder adjacent to decoder DC1 when a decode result of decoder DC1 indicates a selected state at H level and memory cell location instruction signal C0 indicates that a selected memory cell is located in a left half of four memory cells.

Potential supply bus HB0 includes eight potential supply lines HBL1 to HBL8, and voltage levels on the respective potential supply lines are set by HBL switching circuit HSW0 according to information on a selected memory cell location and an operation mode. Since eight bit lines are selectively connected to respective eight potential supply lines HBL1 to HBL8, column selecting switches SW1 to SW5 are provided in correspondence to respective bit lines BL1 to BL5. Output signals of two decoders DC attain a selected state and eight bit lines are coupled to potential supply lines HBL1 to HBL8 in a one-to-one correspondence except end portions of memory block MB0. Potential supply lines HBL to which bit lines BL are connected are uniquely determined by column select switches SW.

A similar configuration is also employed in bit line select circuit BS1. In switch control circuit 31, there are representatively shown: a decoder DC2 selecting bit lines BL6 to BL9 simultaneously; a decoder DC3 simultaneously selecting bit lines BL10 to BL13 (not shown); an AND gate AG2 receiving an output signal of decoder DC2 and memory location indication signal C1 to selectively activate decoder DC3; and an AND gate AG3 receiving an output signal of decoder DC3 and memory cell location instruction signal C0 to selectively activate decoder DC2.

In bit line select circuit BS1, voltages depending on an operation mode and a location of a selected memory cell are transmitted from HBL switching circuit HSW1 to potential supply lines HBL11 to HBL18, and potential supply lines HBL11 to HBL18 are coupled to bit lines in one-to-one correspondence except end portion regions of the memory block. Potential supply lines HBL to which bit lines BL are connected are uniquely determined by column selecting switch SW in memory block MB1 as well.

In the configuration shown in FIG. 7, column addresses of memory cells are assigned symmetrically with respect to the block boundary region. Moreover, connection between bit lines BL and potential supply lines HBL is also made symmetrically with respect to the block boundary. With such a symmetrical configuration, directions along which currents flow in memory blocks MB0 and MB1 are made symmetrical with respect to the block boundary, or current flows in opposite directions in adjacent memory blocks.

Figure 8:
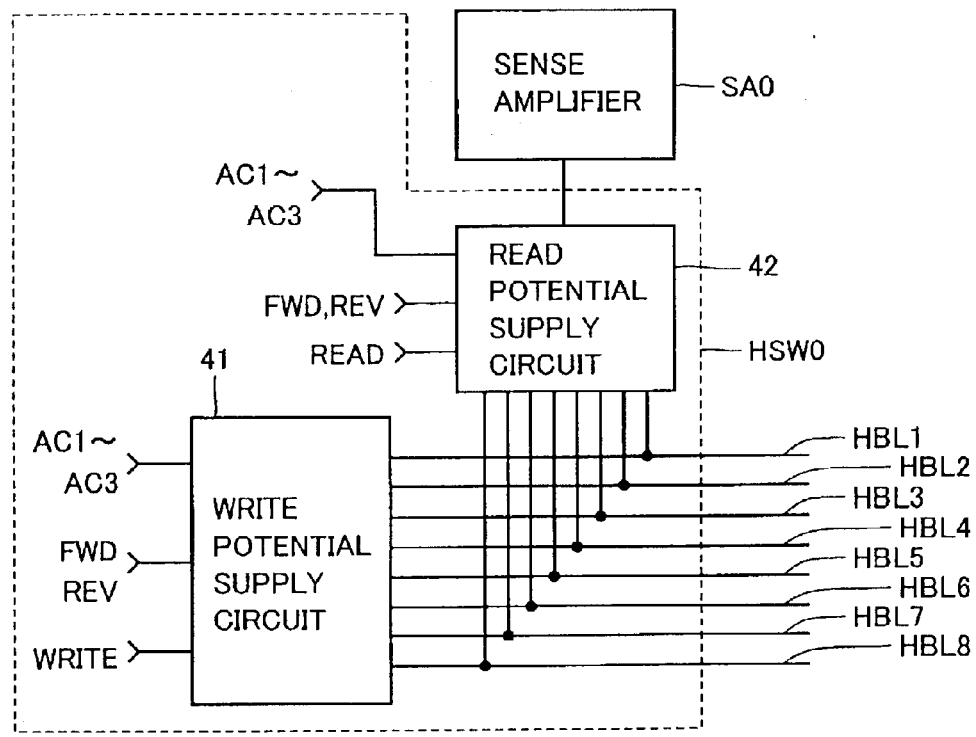
FIG. 8 is a schematic diagram showing a configuration of an HBL switching circuit shown in FIG. 7.

FIG. 8 is a schematic diagram showing a configuration of HBL switching circuit HSW0 shown in FIG. 7. In FIG. 8, HBL switching circuit HSW0 includes: a write potential supply circuit 41 for setting voltage levels on potential supply lines HBL1 to HBL8 in data writing; and a read potential supply circuit for setting voltage levels on potential supply lines HBL1 to HBL8 in a read operation and connecting a potential supply line supplied with a read voltage to sense amplifier SA0.

Write potential supply circuit 41 receives an address signal of three bits AC1 to AC3, forward signal FWD, reverse signal REV and write signal WITE. Address signal bits AC1 to AC3 are the lower three bits of a column address signal.

Forward signal FWD is generated in a forward write operation or a forward read operation in accordance with an externally supplied mode instruction signal. Reverse signal REV is activated in a reverse write operation or a reverse read operation. Forward signal FWD and reverse signal REV may be activated by decoding a specific column address bit instead of an external mode instruction signal. Where forward signal FWD and reverse signal REV are generated in accordance with a mode instruction signal, these signals are generated in a main control circuit. Where forward signal FWD and reverse signal REV are generated in accordance with a specific column address bit, these signals may be generated either by a column address decoder or by a dedicated forward/reverse decode circuit in peripheral circuitry.

Write signal WRITE is activated for a selected bank in a data write operation in accordance with an externally supplied command.

Read potential supply circuit 42, similarly, receives 3-bit address signal AC1 to AC3, forward signal FWD, reverse signal RED and read signal RED. Read signal READ is activated for a selected bank in accordance with an external command.

A configuration of HBL switching circuit HSW1 provided to memory block MB1 is also the same as the configuration of HBL switching circuit HSW0 shown in FIG. 8.

In the configurations of HBL switching circuits HSW0 and HSW1, voltage levels on eight potential supply lines HBL1 to HBL8 and eight potential supply lines HBL1 to HBL18 are set. Therefore, the voltage levels are controlled with each set of eight successively arranged bit lines being a unit. Therefore, in the configurations of bit line select circuits BS0 and BS1, four bit lines provided in correspondence to a decoder and four bit lines adjacent thereto are handled as a unit to connect eight bit lines arranged successively to potential supply lines HBL1 to HBL8 in a one-to-one correspondence.

Consideration will be given to a state where bit line BL1 is provided in correspondence to potential supply line HBL1 and bit line BL2 is provided corresponding to potential supply line HBL2. In this case, a plurality of bit lines BL (8 m+n) in memory block MB0 are selectively coupled to one potential supply line HBLn (n is a natural number). Write potential supply circuit 41 and read potential supply circuit 42 can supply potentials onto a plurality of bit lines through the plurality of potential supply lines HBL. Therefore, the circuit configurations can be simplified. Specifically, write potential supply circuit 41 and read potential supply circuit 42 are not required to control a potential or each respective bit line BL, and the potentials on bit lines BL can be individually controlled only by controlling a potential supply bus HB having the potential supply lines smaller in number than bit lines BL in accordance with input address signal bits AC1 to AC3.

Description will be given of a program operation in data writing of the nonvolatile semiconductor memory device below with reference to FIGS. 7 and 8.

Now, referring to FIG. 7, the description is made of the case where data at H level is written into a storage region (left bit region) L1 of memory cell MC10 of memory block MB0 and data at H level is written into a storage region L2 of memory cell MC20 of memory block MB1. Here, writing of data at H level indicates an operation (programming) in which electrons are injected into a storage region. In writing of data at L level, erasure is performed.

Firstly, decoder DC1 receives column address predecode signals in bit line select circuit BS0 to raise an output signal thereof to H level. Likewise, in bit line select circuit BS1 as well, an output signal thereof is raised to H level in accordance with a column predecode signals applied to decoder DC2. Decoder DC3 receives column predecode signals with a different combination from the combination of the predecode signals applied to decoder DC2, and memory cell location indication signal C0 is also at L level, an output signal of AND gate AG2 is also at L level and an output signal of decoder DC3 is at L level.

In bit line select circuit BLS0, select switches SW2 to SW5 are rendered conductive in accordance with the signal at H level from decoder DC1. Responsively, bit lines BL2 to BL5 are coupled to respective potential supply lines HBL4 to HBL1. The output signal of AND gate AG1 is at L level in a decoder adjacent to decoder DC1 and furthermore, predecode signals of a different combination are applied and an output signal of the adjacent decoder is currently at L level. Therefore, potential supply lines HBL1 to HBL4 are isolated from bit lines since corresponding column select switches SW1 and others are in the off state.

Likewise, column select switches SW6 to SW9 are also rendered conductive in bit line select circuit BS1 in accordance with a decode signal outputted from decoder DC2. In response, bit lines BL6 to BL9 are coupled to respective potential supply lines HBL11 to HBL14. Potential supply lines HBL15 to HBL18 are isolated from bit lines.

Then, HBL switching circuits HSW0 and HSW1 supply prescribed potentials to corresponding potential supply lines. Specifically, for memory block MB0, ground potential GND is supplied to potential supply lines HBL1 and HBL2, write potential VCCW is supplied to potential supply lines HBL3 and HBL4. The other potential supply lines HBL5 to HBL8 are maintained in a floating state.

As a result, bit lines BL2 and BL3 are maintained at write potential VCCW and bit lines BL4 and BL5 are maintained at ground potential. When word line WL1 is selected, a current flows from bit line BL3 to bit line BL4 in memory cell MC10 and data at H level is stored (electrons are injected into an insulating film) into a storage region (right bit region L1).

Bit line BL2 at this time is maintained at write potential VCCW. Therefore, no current flows in a memory cell adjacent to memory cell MC10 connected to bit lines BL4 and BL3. A potential on bit line BL5 is maintained at ground potential GND. Therefore, no current flows in an adjacent memory cell MC connected to bit lines BL4 and BL5 and adjacent to memory cell MC10.

In memory block MB1, potential supply lines HBL11 and HBL12 are maintained at ground potential GND, and potential supply lines HBL13 and HBL14 are maintained at write potential VCCW. Potential supply lines HBL15 to HBL18 are maintained in a floating state. Therefore, bit lines BL8 and BL19 are maintained at write potential VCCW and bit lines BL6 and BL7 are maintained at ground potential GND.

When word line WL1 is selected, a current flows in memory cell MC20 from the bit line BL8 side to the bit line BL7 side and data at H level is stored in the storage region (right bit region) L2 (programming is performed). Both sides of each memory cell adjacent to memory cell MC20 are maintained both at write potential VCCW or ground potential GND, and therefore, no current flows.

Accordingly, even when a write operation is performed on a memory cell of a writing object, no current flows in each memory cell adjacent to the memory cell of the writing object.

Meanwhile, in the write operation, memory cell MC10 is located in the right side of four-bit memory cells constituting a unit, memory cell location instruction signal C0 is at L level and an output signal of AND gate AG1 maintains the L level even if an output signal of decoder DC1 attains H level. Therefore, an output signal from a decoder provided to bit line BL1 is at L level and column select switch SW1 maintains the off state.

In memory block MB1, selected memory cell MC20 is located in the left side of four-bit memory cells arranged to decoder DC2, and an output signal of AND gate AG2 is at L level. Therefore, column select switches are arranged such that connection between bit lines and potential supply lines are made symmetrically with respect to the boundary region in bit line select circuits BS0 and BS1. Thus, even when a memory cell is selected in the boundary region, correct writing to a memory cell can be performed.

When a memory cell in a region other than the boundary region is selected, two decoders are selected to couple bit lines to corresponding potential supply lines. In this case, potential supply lines are set into a floating state for four bit lines. Therefore, a current flowing path is cut off, and no adverse influence is exerted on write operation on a selected memory cell.

The reason why connection between the potential supply lines and the bit lines are performed with a set of eight bit lines being a unit is as follows. In FIG. 7, for example, when writing is performed on a memory cell between bit lines BL2 and BL1, the potentials on bit lines BL1 and BL2 need to be set according to write data. In this case, memory cell location instruction signal C0 attains H level, an output signal of AND gate AG1 is set to H level, bit line BL1 is coupled to potential supply line HBL5 to have the potential set. Therefore, even if four bit lines are selected by one decoder, it is required to select the bit lines of an adjacent unit for connecting the bit lines of the adjacent unit to potential supply lines to set the potentials thereon. Thus, eight potential supply lines are required when an access is made to a memory cell connected to a bit line at an end of the unit.

Figure 9:
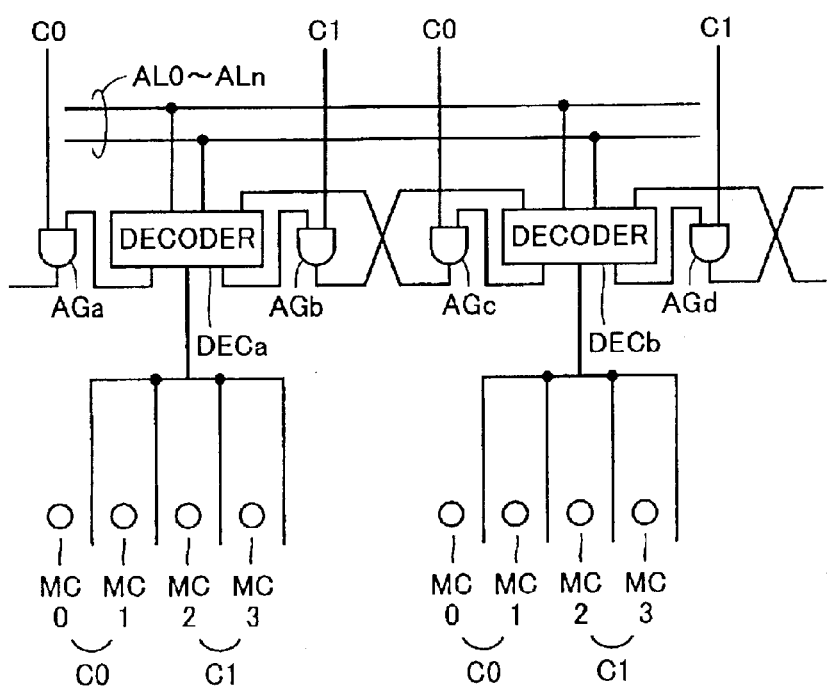
FIG. 9 is a diagram illustrating a memory cell selecting operation in a bit line select circuit shown in FIG. 7.

FIG. 9 is a schematic diagram showing a configuration of a bit line select circuit in a region other than the boundary region in one memory block. In FIG. 9, a bit line select circuit includes decoders DECa and DECb each selecting four bit lines. A decode result of decoder DECa is applied to AND gates AGa and AGb arranged at both sides of the decoder. A decode result of decoder DECb is applied to AND gates AGc and AGd placed at both sides thereof. AND gates AGa and AGc receive memory location indication signal C0, and AND gates AGb and AGd receives memory location indication signal C1.

Memory cell MC0 to MC3 are arranged in correspondence to each of decoders DECa and DECb. When memory cell MC0 or MC1 is designated, memory location indication signal C0 attains H level and when memory cells MC2 and dMC3 are designated, memory location indication signal C1 attains H level.

Decoders DECa and DECb each receive a prescribed combination of predecode signals AL0 to ALn and one decoder is selected by predecode signals AL0 to ALn. A decode result is applied to AND gates placed at both sides of a decoder. Therefore, for example, when decoder DECa is selected, the output signal attains H level. In this state, when memory cell MC2 or MC3 is selected, memory location indication signal C1 attains H level. Therefore, an output signal of AND gate AGb attains H level.

Decoder DECb forcibly raises an output signal of AND gate AGb to H level when the output signal thereof is at H level. On the other hand, memory location indication signal C0 is at L level in this case and an output signal of AND gate AGa is at L level. Therefore, when decoder DECa is selected and memory cell MC2 or MC3 is selected, decoder DECb is selected as well.

On the other hand, when memory cell MC0 or MC1 is selected while decoder DECb is in a selected state, memory location indication signal C0 attains H level. Therefore, an output signal of decoder DECb attains H level, an output signal of AND gate AGc attains H level and in response, an output signal of decoder DECa also attains H level. Accordingly, in a region other than the boundary region, eight bit lines are selected simultaneously and coupled to respective potential supply lines of potential supply bus.

For example, when decoder DECa is selected and memory cell MC3 is selected, if write voltage is applied to the bit line connected to memory cell MC0, bit lines connected to memory cell MC0 provided in correspondence to decoder DECb is set in a floating state. By setting bit lines connected to memory cell MC0 provided to decoder DECb in a floating state, it is reliably prevented that a current flows from a bit line connected to memory cell MC3 through memory cell MC0.

Thereby, a bit line connecting to a memory cell sharing another bit line with a selected memory cell can be set to a floating state or at the same potential as the shared another bit line, preventing a current from flowing unnecessarily. In other words, in the same unit, the source and drain regions of a memory cell sharing a bit line with a selected memory cell can be set at the same potential level to prevent a current from flowing through the source and drain regions. Memory cells outside the unit are set to be in a floating state or the voltages applied in writing are applied. In either event, a current path in non-selected memory cells is cut off. No necessity arises for individually controlling a potential on each respective bit line, but it is only required to consider a voltage between adjacent bit lines and to apply a voltage cyclically on the potential supply bus according to a location of a selected memory cell, thereby facilitating control of a bit line potential.

When memory cell MC1 is selected in decoder DECa, the same voltage or the floating state is set to bit lines of memory cells MC2 and MC3 such that no current flows in memory cell MC2 and MC3. Of eight potential supply lines, two pairs of adjacent potential supply lines are driven to the same potential and the other four potential supply lines are brought into a floating state.

Figure 10:
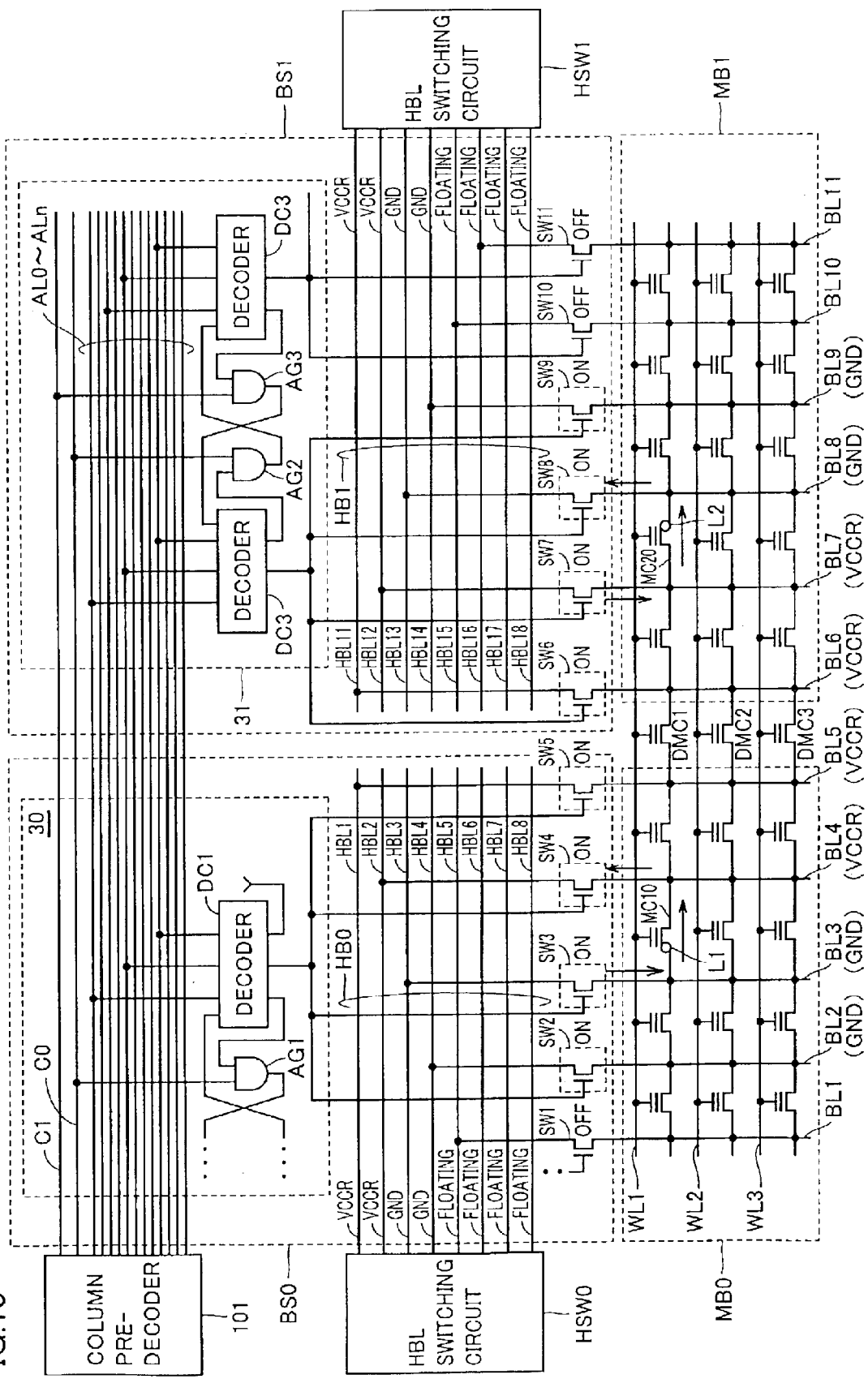
FIG. 10 is a diagram showing applied voltages in data reading on memory blocks and peripheral circuitry thereof shown in FIG. 7.

Then, description will be given of a data read operation in the configuration shown in FIGS. 7 and 8 with reference to FIG. 10. In data reading, operations of decoders DC1 to DC3 of bit line select circuits BS0 and BS1 and column select switches SW1 to SW11 are the same as those in a write operation, and therefore, description thereof will not be repeated.

In a read operation, read signal READ is activated and read potential supply circuit 42 in HBL switching circuit HSW is activated to supply the potentials onto potential supply lines HBL1 to HBL8. Write signal WRITE is at L level and write potential supply circuit 41 is in an inactive state.

In reading of storage data in storage region (left bit region L1) of memory cell MC10, read potential supply circuit 42 supplies the read potential VCCR to potential supply lines HBL1 and HBL2, and ground potential GND to potential supply lines HBL3 and HBL4. The other potential supply lines HBL5 to HBL8 are maintained in a floating state.

Therefore, bit lines BL2 and BL3 are maintained at ground potential GND and bit lines BL4 and BL5 are maintained at read potential VCCR. In response, in memory cell MC10, a current flows in a direction from bit line BL4 to bit line BL3, thereby enabling sense amplifier to read data in storage region L1.

Sense amplifier 43 receives and amplifies a current flowing through potential supply line HBL3 to generate internal read data. Connection between sense amplifier 43 and potential supply line UBL3 is made by selecting a power supply line by a sense decoder in read potential supply circuit 42. The sense decoder selects a drain bit line provided in correspondence to a drain of a selected memory cell in accordance with column address signal bits AC1 to AC3, forward signal FWD and reverse signal REV. One memory cell out of eight memory cells is selected by 3-bit column address signal AC1 to AC3 to identify corresponding two potential supply lines and further to select a potential supply line connected to the drain bit line of the selected memory cell by forward signal FWD and reverse signal REV.

Alternatively, where the lowest three bits of column address signal, AC1 to AC3 specify a storage region, that is, a right bit region and a left bit region of a memory cell as well as the memory cell, a potential supply line may be selected and connected to a sense amplifier in accordance with a decode result of 3-bit address signal AC1 to AC3 since a current flows in a reverse direction in data reading.

Bit lines BL2 and BL3 are maintained at ground potential and bit lines BL4 and BL5 are maintained at read potential VCCR. Therefore, in a memory cell adjacent to the selected memory cell MC10, potentials at both sides thereof are the same as each other with no current flowing therein.

Column select switch SW11 is in the off state and bit line BL11 is in a floating state.

This holds in a data reading operation for a storage region (right bit region) L2 of memory cell MC20 of memory block MB1.

In this case, in memory block MB1, by HBL switching circuit HSW1, read potential VCCR is supplied to potential supply lines HBL11 and HBL12, and ground potential GND is supplied to potential supply lines HBL13 and HBL14. Bit lines BL6 and BL17 are maintained at read potential VCCR and bit lines BL8 and BL9 are maintained at ground potential GND. Therefore, in memory cell MC20, a current flows in a direction from bit line BL7 to bit line BL8 to read storage data in storage region L2.

Bit line BL10 is in a floating state since a corresponding column switch SW10 is in the off state.

Conduction nodes of memory cells on both sides of memory cell MC20 are maintained at read potential VCCR or ground potential GND, causing no current flow. Therefore, by providing HBL switch circuits HSW0 and HSW1 as described above, a memory cell is selected in each memory block and a write operation or a read operation can be performed simultaneously.

In this configuration, dummy cells DMC1 to DMC3 are provided between memory clocks MB0 to MB1, the source and drain of each dummy cell are maintained at the same potential and it is prevented that a current flows in each dummy cell DMC, thereby ensuring correct reading of data in a memory cell in each of memory blocks MB0 and MB1.

Especially, in an arrangement of memory cells shown in FIG. 7, decoders are provided in bit line select circuits BS0 and BS1, respectively, such that memory cells including storage regions are symmetrically selected and connected to potential supply lines HBL in memory blocks MB0 and MB1. Therefore, a case occurs where a memory cell between bit lines BL4 and BL5 and a memory cell between bit lines BL6 and BL7 are both selected simultaneously.

In this case, such a state occurs where in programming, for example, write voltage VCCW is applied onto bit line BL5 and a ground potential GND is supplied onto bit line BL6. Forward signal FWD and reverse signal REV are commonly applied to HBL switching circuits HSW0 and HSW1. Therefore, in memory blocks MB0 and MB1, accesses to the right bit region and left bit region of the respective memory cells are regularly performed in parallel to each other. Therefore, voltages at the same level are transmitted to bit lines BL5 and BL6 and leakage currents in dummy cells DMC1 to DMC3 can be reliably suppressed, thereby preventing generation of a through current between blocks.

Where in data reading, read voltage VCCR is transmitted onto bit lines BL2 and BL3 and ground voltage GND is transmitted onto bit lines BL4 and BL5, such a state can be considered that a read current flows from bit lines BL3 to bit line BL5. In this state, however, a memory cell between bit lines BL4 and BL5 has the source and drain set at ground voltage and dummy cells are connected to bit line BL 5, and therefore, it can be reliably prevented that a current flows from memory block MB0 to memory block MB1.

This holds for a current flowing from memory block MB1 to memory block MB0. Therefore, writing and reading of data can be correctly performed in units of memory blocks.

Modifications of Bit Line Select Circuit and Memory Block

Figure 11:
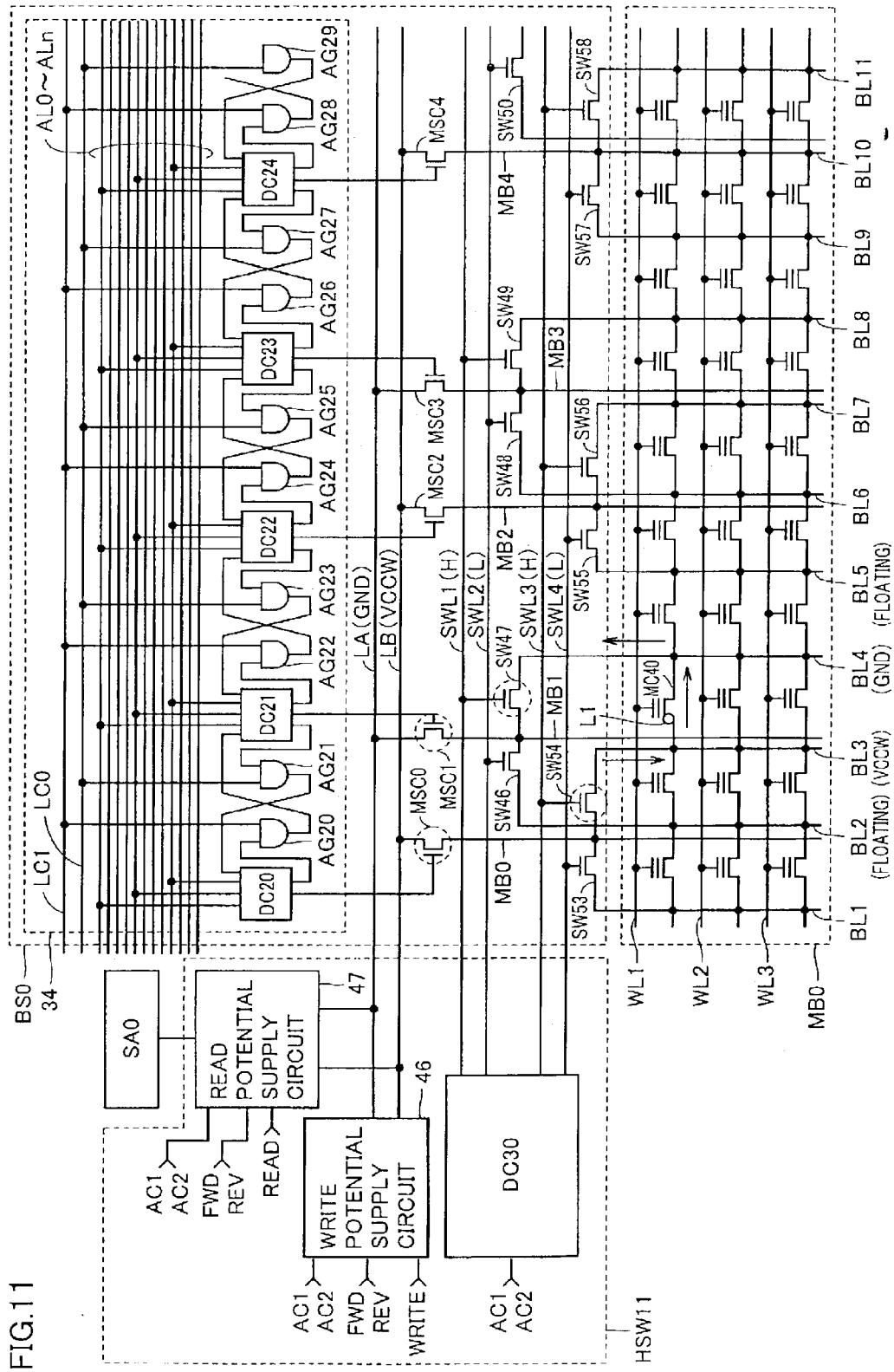
FIG. 11 is a specific diagram showing a configuration of the other parts of memory blocks and peripheral circuitry shown in FIG. 6.

FIG. 11 is a diagram showing modifications of configurations of bit line select circuit and a memory block of a nonvolatile semiconductor memory device according to the first embodiment of the present invention. Referring to FIG. 11, in memory block MB0, memory cells MC are arranged in rows and columns. In FIG. 11, there are representatively shown memory cells arranged in three rows and 10 columns. Word lines WL1 to WL3 are provided in correspondence to the respective memory cell rows and bit lines BL1 to BL10 are provided corresponding to the memory cell columns and each being shared by memory cells adjacent to each other.

In such a memory array structure, a main bit line MB is further provided in correspondence to two bit lines sandwiching one bit line. In FIG. 11, main bit line MB0 is provided in correspondence to bit lines BL1 and BL3, main bit line MB1 is provided in correspondence to bit lines BL2 and BL4, main bit line MB2 is provided in correspondence to bit lines BL5 and BL7 and main bit line MB3 is provided in correspondence to bit lines BL6 and BL8. Main bit line MB4 is provided in correspondence to bit lines BL9 and BL11, and main bit line MB5 not shown is provided in correspondence to bit line BL10 and not-shown bit line BL12.

In this memory array structure, two main bit lines are provided for each set of four memory cells arranged in the row direction. Two bit lines of a set of four bit lines are selected and coupled to potential supply lines LA and LB.

Main bit line MB0 is coupled to bit lines BL1 and BL3 through sub-column select switches SW53 and SW54, and main bit line MB1 is coupled to bit lines BL2 and BL4 through sub-column select gates SW46 and SW47. Main bit line MB2 is coupled to bit lines BL5 and BL7 through sub-column select switches SW55 and SW56. Main bit line MB3 is coupled to bit lines BL6 and BL8 through sub-column select switches SW48 and SW49. Main bit line MB4 is coupled to bit lines BL9 and BL11 through sub-column select switches SW57 and SW58.

Main bit lines MB0, MB2 and MB4 are coupled to potential supply line LB through main column select switches MSC0, MSC2 and MCS4, and main bit lines MB1 and MB3 are coupled to potential supply line LA through main column select switches MSC1 and MCS3.

Switch control circuit 34 is provided in order to control a conduction and a non-conduction of each of main select switches MSC0 to MSC4. In switch control circuit 34, decoders DC20 to DC24 are provided in correspondence to respective main column select switches MSC0 to MSC4. Prescribed sets of predecode signals AL0 to ALn are applied to respective decoders DC20 to DC24. Predecode signals AL0 to ALn designate two bit lines by a combination of three predecode signals. In other words, one main bit line is designated by predecode signals AL0 to ALn.

In order to select two main bit lines simultaneously, AND gates AG20 to AG29 are further provided. AND gate AG20 receives a decode result of decoder 20 and a memory location indication signal LC1 to apply an output signal thereof to decoder DC21. AND gate AG21 receives a decode result of decoder DC21 and memory location indication signal LC0 to apply an output signal thereof to decoder DC20. AND gate AG22 receives a decode result of decoder DC21 and memory location indication signal LC1 to give an output signal thereof to decoder DC22. AND gate AG23 receives a decode result of decoder DC22 and memory location indication signal LC0 to apply an output signal thereof to decoder DC21.

AND gate AG24 receives a decode result of decoder DC22 and memory location indication signal LC1 to apply an output signal thereof to decoder DC23. AND gate AG25 receives a decode result of decoder DC23 and memory location indication signal LC0 to apply an output signal thereof to decoder DC22.

AND gate AG26 receives a decode result of decoder DC23 and memory location indication signal LC1 to apply an output signal thereof to decoder DC24. AND gate AG27 receives a decode result of decoder DC24 and memory location indication signal LC0 to apply an output signal thereof to decoder DC23. AND gate AG28 receives a decode result of decoder DC24 and memory location indication signal LC1 to apply an output signal thereof to a decoder (DC25) not shown. AND gate AG29 receives a decode result of a decoder (decoder DC25) not shown and memory location indication signal LC0 to apply an output signal thereof to decoder DC24.

A configuration of each of decoders DC20 to DC24 is similar to those of memory cell decoders DC1 to DC3 in the configuration shown previously in FIG. 7. When a received set of predecode signals designates a corresponding main bit line, a decode result is set to H level. When any of output signals of AND gates placed on both sides of a decoder and a decode result thereof attains H level, an output signal of the decoder is set to H level.

Memory location indication signals LC1 and LC0 are generated by pre-decoding the lowest address signal bit. Which of two adjacent memory cells, a right memory cell and a left memory cell, is accessed is designated by memory cell location instruction signals LC0 and LC1.

HBL switching circuit HSW11 is provided in order to control potential supply onto potential supply lines LB and LA and connection between a main bit line and associated bit lines. HBL switching circuit HSW11 includes: a write potential supply circuit 46 supplying write voltages to potential supply lines LA and LB in a write operation; a read potential supplying circuit 47 supplying a prescribed potential onto potential supply lines LA and LB in a read operation; and a decoder DC30 decoding 2-bit address signal, AC1 and AC2 to selectively drive switch select lines SWL1 to SWL4.

Write potential supply circuit 46 receives address signal bits AC1 and AC2, forward signal FWD, reverse signal REW and write signal WRITE. Read potential supply circuit 47 receives address signal bits AC1 and AC2, forward signal FWV, reverse signal REV and read signal READ.

Decoder DC30 drives one of switch select lines SWL1 and SWL2 into a selected state and one of switch select lines SWL3 and SWL4 into a selected state in accordance with address signal bits AC1 and AC2. At this time, one bit line is connected to each of two main bit lines provided in correspondence to four bit lines.

Output signals of decoders DC20 to DC24 are provided to respective main column select switches MSC0 to MSC4. A sub-column select signal on switch select line SWL1 is applied to sub-column select switches SW47 and SW49. A sub-column select signal on switch select line SWL2 is applied to sub-column select switches SW46 and SW48. A sub-column select signal on switch select line SWL3 is applied to sub-column select switches SW54, SW56 and SW58. A sub-column select signal on switch select line SWL4 is applied to sub-column select switches SW53, SW55 and SW57. Now, description will be given of operations of bit line select circuit BS0 shown in FIG. 11 in the case where data is written into a storage region (left bit region) L1 of memory cell MC40 in memory block MB0.

First, read signal READ is at L level and write signal WRITE attains H level. Read potential supply circuit 47 is caused to cease its operation and write potential supply circuit 46 supplies write voltages according to a location of a selected memory cell to potential supply lines LA and LB. When data at H level is written into storage region L1 of memory cell MC40 (programming is performed), write potential supply circuit 46 supplies ground potential GND to potential supply line LA and write potential VCCW to potential supply line LB. Decoder DC30 transmits a signal at H level onto switch select lines SWL1 and SWL3 in accordance with address signal bits AC1 and AC2.

In switch control circuit 34, decoder DC21 is selected and an output signal thereof attains H level. A decode result of decoder DC21 indicates a selected state, memory location indication signal LC0 is at H level, an output signal of AND gate AG21 attains H level and in response, an output signal of decoder DC20 is driven to H level.

Main column select switches MSC0 and MCS1 are rendered conductive in accordance with output signals of decoders DC0 and DC21, thereby coupling main bit lines MB0 and MB1 to potential supply lines LB and LA, respectively. Write voltage VCCW is supplied onto main bit line MB0 and ground voltage GND is supplied onto main bit line MB1.

Since switch select lines SWL1 and SWL3 are at H level, sub-column select switches SW54 and SW47 turn conductive, main bit lines MB0 and MB1 are coupled to respective bit lines BL3 and BL4, and bit lines BL3 and BL4 are supplied with write voltage VCCW and ground potential GND, respectively. Bit line BL2 maintains a floating state since sub-column select switch SW46 is in a non-conductive state.

In this state, a current flows from bit line BL3 connected to memory cell MC40 to bit line BL4, and data at H level can be written in storage area L1 of memory cell MC40 (memory cell MC40 can be set to the programmed state). In this case, bit line BL2 is in a floating state, which can prevent a current of bit line BL3 from flowing into bit line BL2.

Therefore, with a similar operation performed, a write operation can be performed on a specific memory cell. In write potential supply circuit 46, potentials on potential supply lines LA and LB are set in one of forward and reverse directions in accordance with address signal bits AC1 and AC2, forward signal FWD and reverse signal REV. In write potential supply circuit 46, write data is supplied and it is determined whether or not a write high voltage is to be applied onto potential supply lines LA and LB in accordance with the write data. The write high voltage is applied onto potential supply lines LA or LB in writing of H level data.

Decoder DC30 selects one memory cell from four memory cells in accordance with address signal bits AC1 and AC2, and two bit lines, which are connected to the selected memory cell, are connected to the main bit lines of a corresponding pair.

In a read operation, when data in storage region L1 of memory cell MC40 is read, read potential VCCR is supplied onto bit line BL4 and ground potential is supplied onto bit line BL3. Bit lines BL3 and BL4 are held at the supplied potential levels. Potential supply line LA at read voltage level is coupled to sense amplifier SA0 by read potential supply circuit 47. In this case, select operations for a main bit line and a bit line in reading of memory cell data are the same as in data writing.

In the case shown in FIG. 11, it is possible to cause main bit line MB to have a function similar to that of potential supply line HBL. Therefore, not only can a potential supply line and a word line be arranged in parallel to each other, but a potential supply line and a bit line can also be arranged in parallel to each other utilizing a main bit line.

In a memory block of FIG. 11, there is employed a hierarchical structure of a main bit line/bit lines. However, where bit lines are of a non-hierarchical structure, and a hierarchical decode scheme is employed in which four bit lines selected by an operation of a decoder are forcibly put into a floating state by potential supply lines, a set of bit lines is constructed of four bit lines and the number of potential supply lines may be 4 or alternatively, the similar configuration (the hierarchical decoding scheme) can be applied to the case of the number of potential supply lines being 6.

Therefore, layout of potential supply lines HBL and the hierarchical decoding scheme or the hierarchical bit lines structure can be appropriately determined in accordance with an allowable area of the memory blocks. Thereby, there can be implemented a semiconductor memory device excellent in area utilization efficiency and capable of performing correct writing/reading of data in units of memory cell blocks.

In the first embodiment, in data writing or data reading to or from a memory block, a data access to another bank can be performed in parallel.

Figure 12:
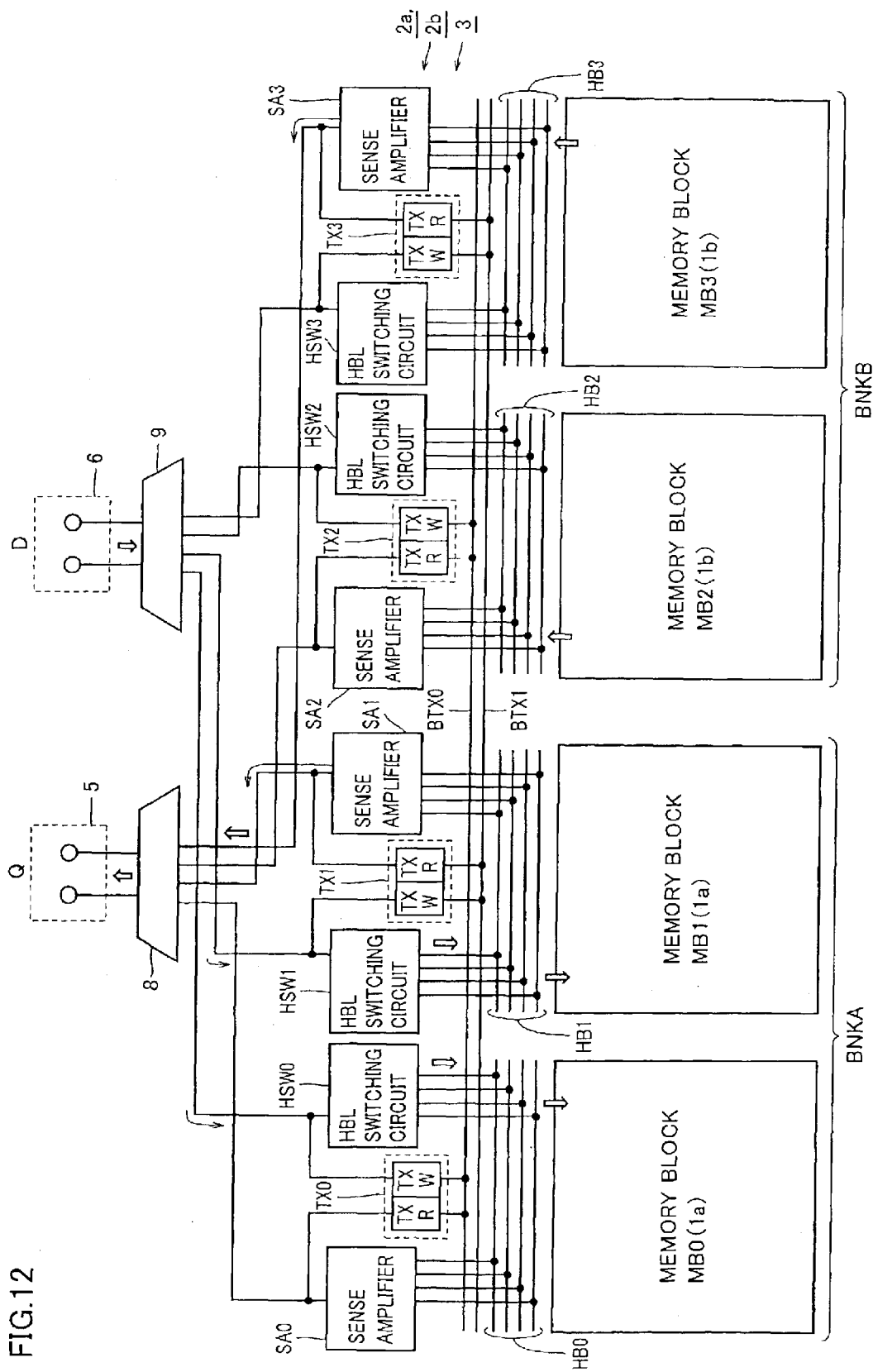
FIG. 12 is a diagram illustrating a first data transfer processing mode in the first embodiment of the present invention.

FIG. 12 is a diagram showing a data flow in a first data transfer processing mode in a nonvolatile semiconductor memory device according to the first embodiment of the present invention. In FIG. 12, data writing is performed on bank BNKA and data reading is performed on bank BNKB. Both operations are performed in parallel. In the first data transfer processing mode, write data is supplied to HBL switching circuits HSW0 and HSW1 of bank BNKA through select circuit 9. HBL switching circuits HSW0 and HSW1 supply prescribed voltages onto potential supply bus HB0 and HB1 in accordance with the write data, and an address signal, a reverse/forward signal and write instruction signal not shown, to write the data to selected memory cells of memory blocks MB0 and MB1.

Configurations of memory blocks MB0 to MB3 are may be any of the configurations shown previously. Therefore, a configuration of potential supply buses HB0 to HB3 is also appropriately determined in accordance with the configuration of memory blocks MB0 to MB3.

In bank BNKB, a read voltage and ground voltage are supplied to selected memory cells in memory blocks MB2 and MB3 of bank BNKB by HBL switching circuits HSW2 and HSW3 through potential supply buses HB2 and HB3, and storage data in the selected memory cells are read by sense amplifiers SA2 and SA3. Select circuit 8 selects read data of sense amplifiers SA2 and SA3 to output the selected read data externally through read port 5.

Sense amplifiers SA0 to SA3 and HBL switching circuits HSW0 to HSW3 are provided to respective memory blocks MB0 to MB3, and data writing and data reading can be performed in parallel in units of banks. Where a time required for data writing is long (for example, in a case where a large volume of data are written in an operation mode such as burst write), an access can be made to one bank to read data, while writing is performed on another bank, thereby improving a data processing efficiency.

When writing/reading of data is performed bit by bit, a time required for writing is longer than a time required for reading since charges are injected into an insulating film in programming. Therefore, by supplying a read command instructing reading of data in the next cycle following a cycle of supply of a write command instructing data writing to another bank, data transfer can be performed utilizing a waiting time when a write command is supplied, thereby allowing a data transfer efficiency to be improved.

Figure 13:
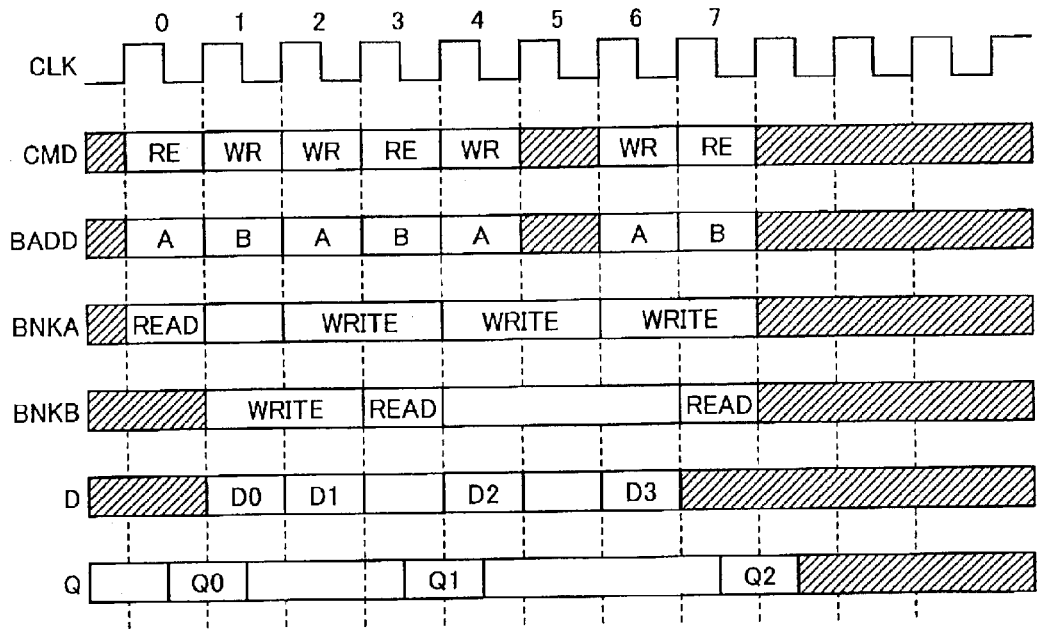
FIG. 13 is a timing chart representing an example of access sequence in the first data transfer processing mode shown in FIG. 12.

FIG. 13 is a diagram showing an exemplary sequence in the first data transfer processing mode shown in FIG. 12. In FIG. 13, there is shown, as one example, a case where command CMD is issued in synchronization with a system clock CLK.

In cycle 0, read command RE instructing data reading is supplied together with an address signal. In FIG. 13, there is shown bank address BADD. In cycle 0, read command RE for bank A is supplied. In bank BNKA, a data read operation is performed in accordance with read command RE and data Q0 is outputted.

In the next cycle 1, write command WR instructing data writing is supplied to bank BNKB. A case is considered, as one example, where data writing requires two clock cycles of system clock CLK and data reading is completed in one cycle. In this case, data writing is performed over cycle 1 to cycle 2 in bank BNKB.

In cycle 2, write command WR instructing data writing is supplied to bank BNKA. Therefore, in this case, since a read operation is already completed in bank BNKA, data writing is performed.

In cycle 3, read command RE is supplied to bank B. In cycle 3, data D1 is read from bank BNKB. In cycle 3, data writing is performed in bank BNKA.

In cycle 4, write command WR together with write data D2 is supplied to bank BNKA and in cycle 6, write command WR together with write data D2 and D3 is supplied to bank A.

In cycle 7, read command RE is supplied to bank B, data reading is performed in bank BNKB and data Q2 is read from bank BNKB. In this cycle, data writing is performed in bank BNKA.

Therefore, where, for example, it takes two clock cycles to write data and data reading is performed in one clock cycle, by making a read access (data reading) to a bank different from a bank currently under data writing, data can be efficiently transferred between a bank and a processing device such as an external processor.

Figure 14:
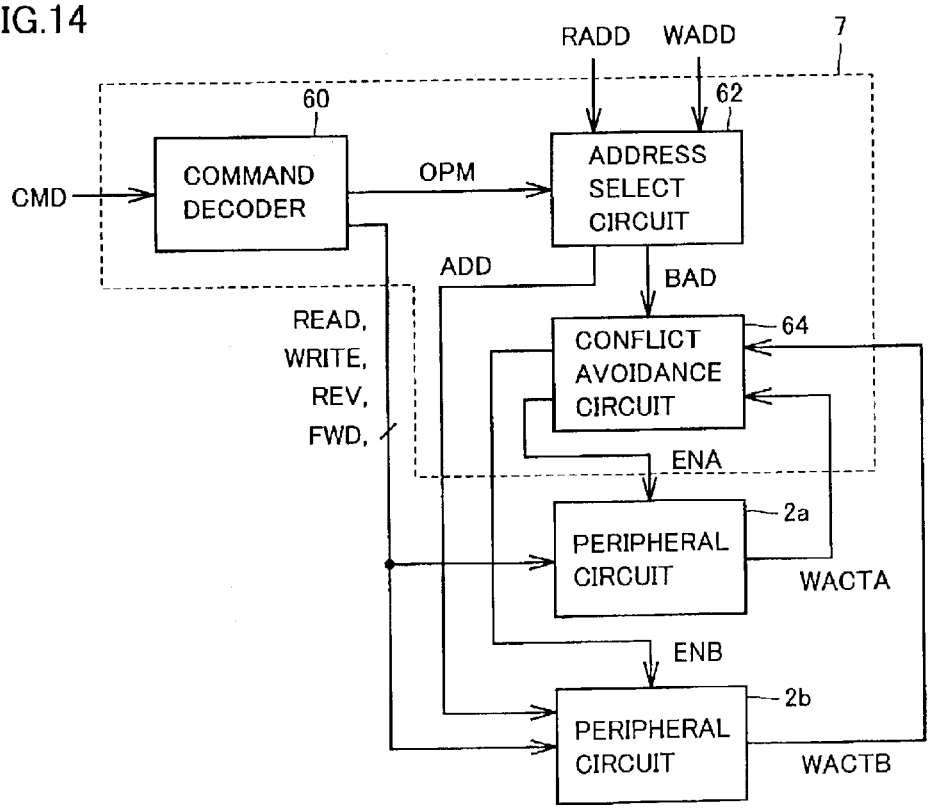
FIG. 14 is a schematic diagram showing an example of a configuration of a main control circuit shown in FIG. 5.

FIG. 14 is a diagram showing an example of a configuration of a part related to a parallel access in the configuration of main control circuit 7 shown in FIG. 5. Peripheral circuits 2a and 2b are provided in respective banks BNKA and BNKB. Peripheral circuits 2a and 2b each include a sense amplifier and HBL switching circuit for each memory block. Peripheral circuits 2a and 2b activate write activation signals WACTA and WACTB during execution of internal write operations. An external access is prohibited to a corresponding bank in a period when write activation signal WACTA or WACTB is active.

Write activation signals WACTA and WACTB may be generated in a similar manner to a write state indicating flag stored in a status register used in a flash memory in which charges are accumulated in the polysilicon floating gate. In addition, a flip-flop or the like may be simply used to maintain write activation signals WACTA and WACTB in an active state until completion of writing for corresponding banks in response to activation of write signal WRITE.

Main control circuit 7 includes: a command input circuit 4a shown in FIG. 5; a command decoder 60 for decoding a command; an address select circuit 62 for selecting one of read address signal RADD and write address signal WADD in accordance with operation mode instruction signal OPM from command decoder 60; and a conflict avoidance circuit 64 for determining whether or not an access can be made to a selected bank in accordance with bank address BAD from address select circuit 62 and write activation signals WACTA and WACTB.

Conflict avoidance circuit 64 applies enable signals ENA and ENB to respective peripheral circuits 2a and 2b when the requested access can be made. While enable signals ENA and ENB are active, peripheral circuits 2a and 2b perform selection of a memory cell and writing/reading of data in accordance with read signal READ, write signal WRITE, reverse signal REV and forward signal FWD given from command decoder 60 and address signal ADD from address select circuit 62.

A command formed of a combination of control signals may be supplied to command decoder 60, or alternatively, read command READ, write command WRITE, reverse signal REV and forward signal FWD may be applied individually as separate signals. Operation mode instruction signal OPM includes a read mode instruction signal instructing data reading and a write mode instruction signal instructing data writing.

Address select circuit 62 selects an address signal corresponding to an operating mode designated by operation mode instruction signal OPM from read address signal RADD and write address signal WADD.

In the configuration of main control circuit 7 shown in FIG. 14, an access to a bank to which a write operation is performed is prohibited and thereby, correct writing/reading of data can be performed in parallel.

In the configuration of main control circuit 7 shown in FIG. 14, command decoder 60 is commonly provided to a data write mode and a data read mode. Where command ports are provided in correspondence to a read port and a write port, respectively, however, a read command and a write command can be supplied to different banks BNKA and BNKB in parallel in the same cycle. In the case of this configuration, it is detected in conflict avoidance circuit 64 that a read address and a write address applied in the same cycle designate different banks, and peripheral circuits are activated when a bank is accessible (in an inactive state of write activation signal WACT). In this case, however, signal interconnection liens for transmitting internal commands are required to be provided to the read port and write port, separately, thereby increasing an interconnection layout area as compared with the configuration shown in FIG. 14.

Figure 15:
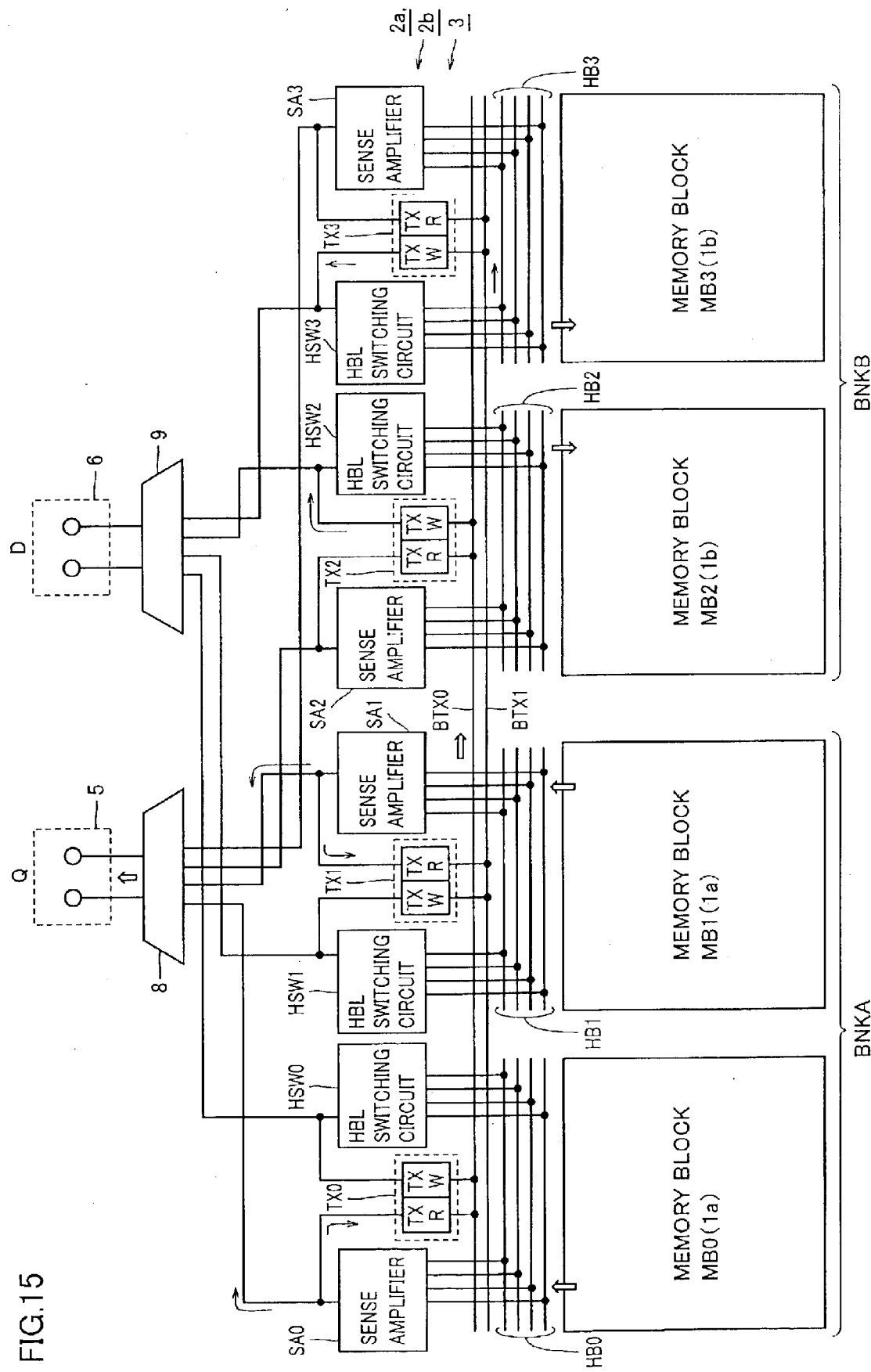
FIG. 15 is a diagram showing a second data transfer processing mode in the first embodiment of the present invention.

FIG. 15 is a diagram showing a second data transfer processing mode in a nonvolatile semiconductor memory device according to the first embodiment of the present invention. In a data transfer processing shown in FIG. 15, data Q is read from bank BNKA, and data bits read from memory blocks MB0 and MB1 of bank BNKA are also transferred and written in parallel to bank BNKB.

Specifically, internal data outputted from sense amplifiers SA0 and SA1 provided in correspondence to respective memory blocks MB0 and MB1 of bank BNKA are transferred onto bidirectional data transfer lines BTX0 and BTX1 through read transfer switches TXR of transfer switch circuits TX0 and TX1. Data transferred onto bidirectional data transfer lines BTX0 and BTX1 are supplied to HBL switching circuits HSW2 and HSW3 through write transfer switches TXW of transfer switch circuits TX2 and TX3, respectively.

HBL switching circuits HSW2 and HSW3 supply the potentials corresponding to write data and locations of selected memory cells onto respective main supply buses HB2 and HB3 in accordance with transferred data, to write transfer data to the selected memory cells of memory blocks MB2 and MB3. In this case, as to an address signal, an internal address signal same as read data may be used as a write address signal or alternatively, in a transfer operation, a write address signal applied simultaneously with a supplied read/transfer command may be used as a transfer destination address.

In the data transfer processing mode shown in FIG. 15, data in bank BNKA is saved into bank BNKB concurrently with external data reading from bank BNKA. In this case, data saving is performed by internal transfer of data, and there is no need to read the data once externally and then to apply again the write data for saving of the data, improving a processing efficiency.

As to a processing sequence, where data read from bank BNKA is processed in an external processing apparatus, data after the processing is written at original locations of bank BNKA, and thereafter a processing is again performed using pre-processing original data, such processing can be efficiently performed only by switching of banks. For example, in an image processing, a processing such as an a blending operation of superimposing images can be efficiently performed.

Where read data is transferred and written to bank BNKB in parallel to data reading from bank BNKA, a write time is longer than a data read time, and therefore, transfer data is sequentially held and writing is performed according to the held transfer data. Data is transferred from one bank to another bank to be saved for placing the same data in different banks. Thereafter, by performing reading and writing of data from and to the banks, writing and reading of data in the same bank can be equivalently performed simultaneously.

Figure 16:
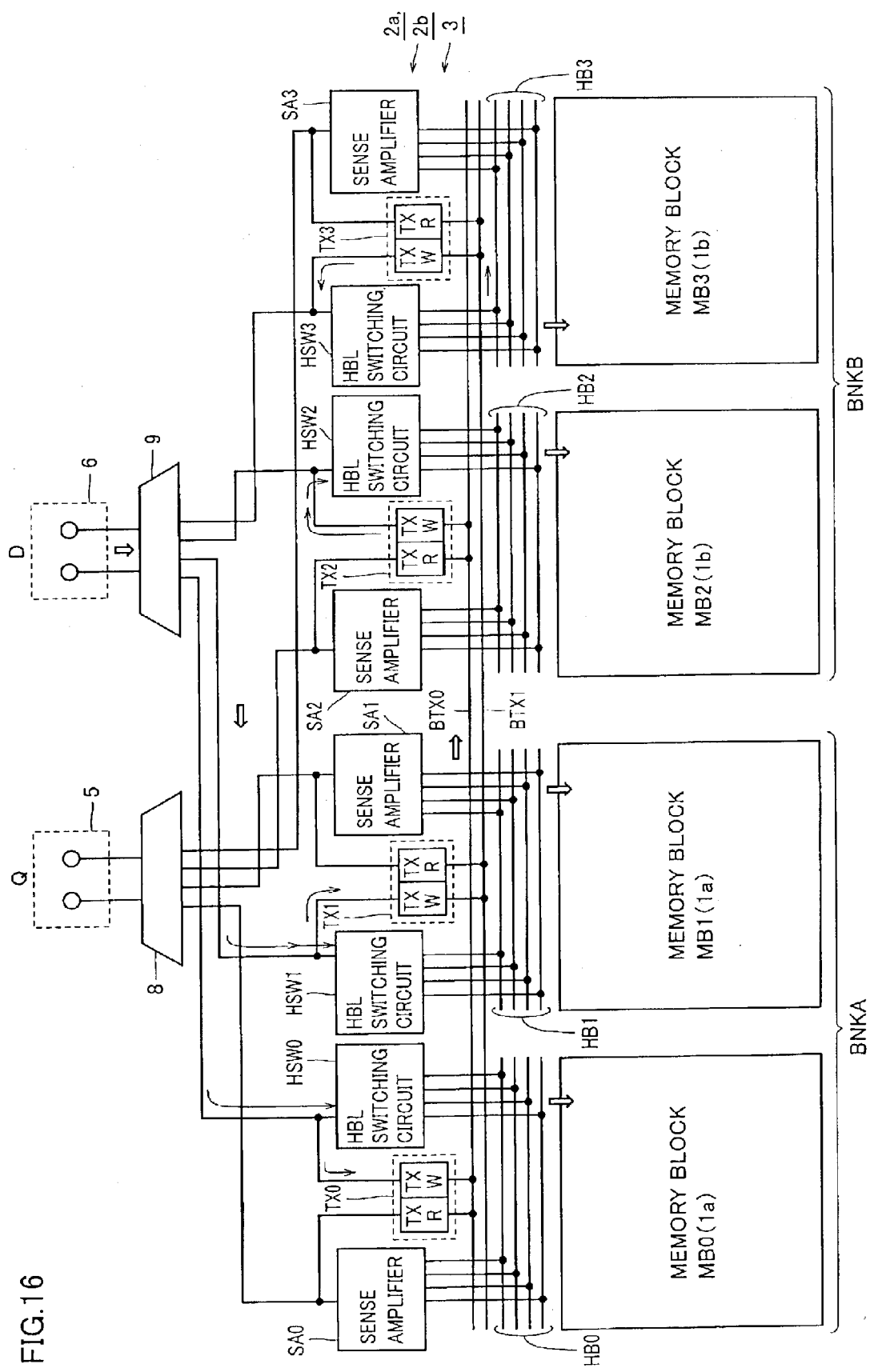
FIG. 16 is a diagram showing a third data transfer processing mode in the first embodiment of the present invention.

FIG. 16 is a schematic diagram showing a third data transfer processing mode in the first embodiment of the present invention. In the data transfer processing mode shown in FIG. 16, in writing data to bank BNKA, the write data is transferred to bank BNKB for writing the write data to memory blocks MB2 and MB3 of bank BNKB.

Specifically, write data transferred from select circuit 9 is transferred to HBL switching circuits HSW0 and HSW1 provided to bank BNKA and written into memory blocks MB0 and MB1. Write data transferred from select circuit 9 is transferred onto bidirectional data transfer lines BTX0 to BTX1 through write transfer switches TXW included in transfer switch circuits TX0 and TX1. Write data on bidirectional data transfer lines BTX0 and BTX1 are given onto HBL switching circuits HSW2 and HSW3 through write transfer switches TXW included in transfer switch circuits TX2 and TX3.

HBL switching circuits HSW2 and HSW3 are activated in a transfer mode to drive potential supply buses HB2 ad HB3 in accordance with received data and address signal, to write the transfer data to memory blocks MB2 and MB3. As to an address designating a transfer destination, an address applied to write port is used. In this case, the same data is written at the same address of banks BNKA and BNKB.

In the third data transfer processing mode, the same data is written to banks BNKA and BNKB. Therefore, while data writing is performed in one of banks BNKA and BNKB, data can be read from the other bank and for example, necessary data can be transferred at high speed in a copy-back operation in a cache memory.

A bank serving as a transfer destination can be utilized as a back-up memory.

Figure 17:
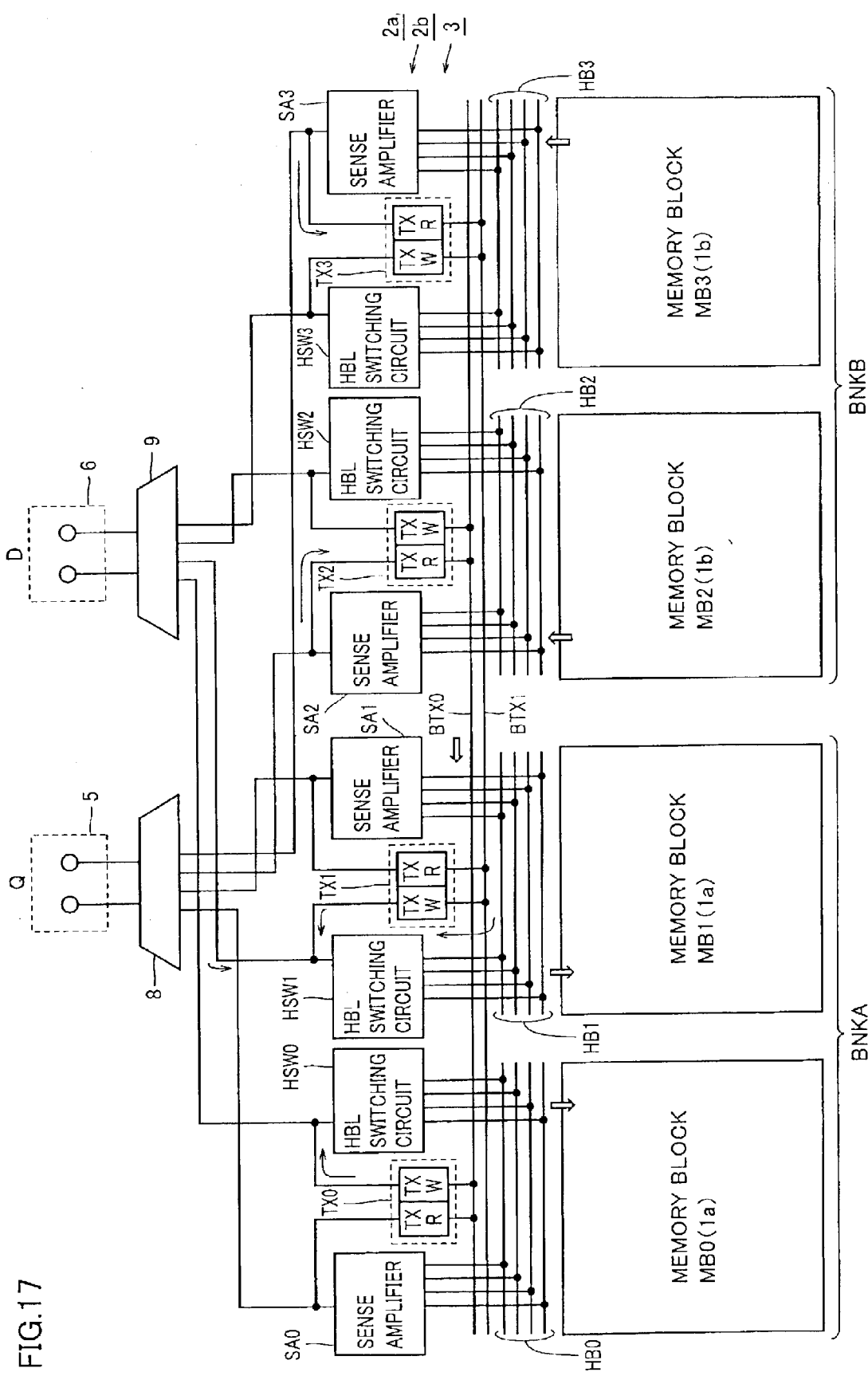
FIG. 17 is a diagram showing a fourth data transfer processing mode in the first embodiment of the present invention.

FIG. 17 is a schematic diagram showing a fourth data transfer processing mode. In the data transfer processing mode shown in FIG. 17, data is internally transferred from bank BNKB to bank BNKA and stored there. Specifically, in bank BNKB, storage data in memory cells of memory blocks MB2 and MB3 are detected by sense amplifiers SA2 and SA3, and supplied to transfer switch circuits TX2 and TX3. In transfer switch circuits TX2 and TX3, the data read from sense amplifiers SA2 and SA3 are transferred onto bidirectional data transfer lines BTX0 and BTX1 by read transfer switches TXR.

Data supplied onto bidirectional data transfer lines BTX0 and BTX1 are supplied to HBL switching circuits HSW0 and HSW1 through write transfer switches TXW included in transfer switch circuits TX0 and TX1. HBL switching circuits HSW0 and HSW1 set the voltage levels on corresponding potential supply buses HB0 and HB1 in accordance with an address signal not shown and transfer data not shown, to write the data to selected memory cells of memory blocks MB0 and MB1.

Data transfer from bank BNKA to bank BNKB is performed by reversing the above data flow. Data is internally transferred between banks without writing data to another bank after reading the data externally once, and the third transfer processing mode is effective for data saving. Data transfer between banks BNKA and BNKB is internally performed without using an external bus. Therefore, internal data transfer can be performed concurrently with an operation of another device connected to such external bus.

Figure 18:
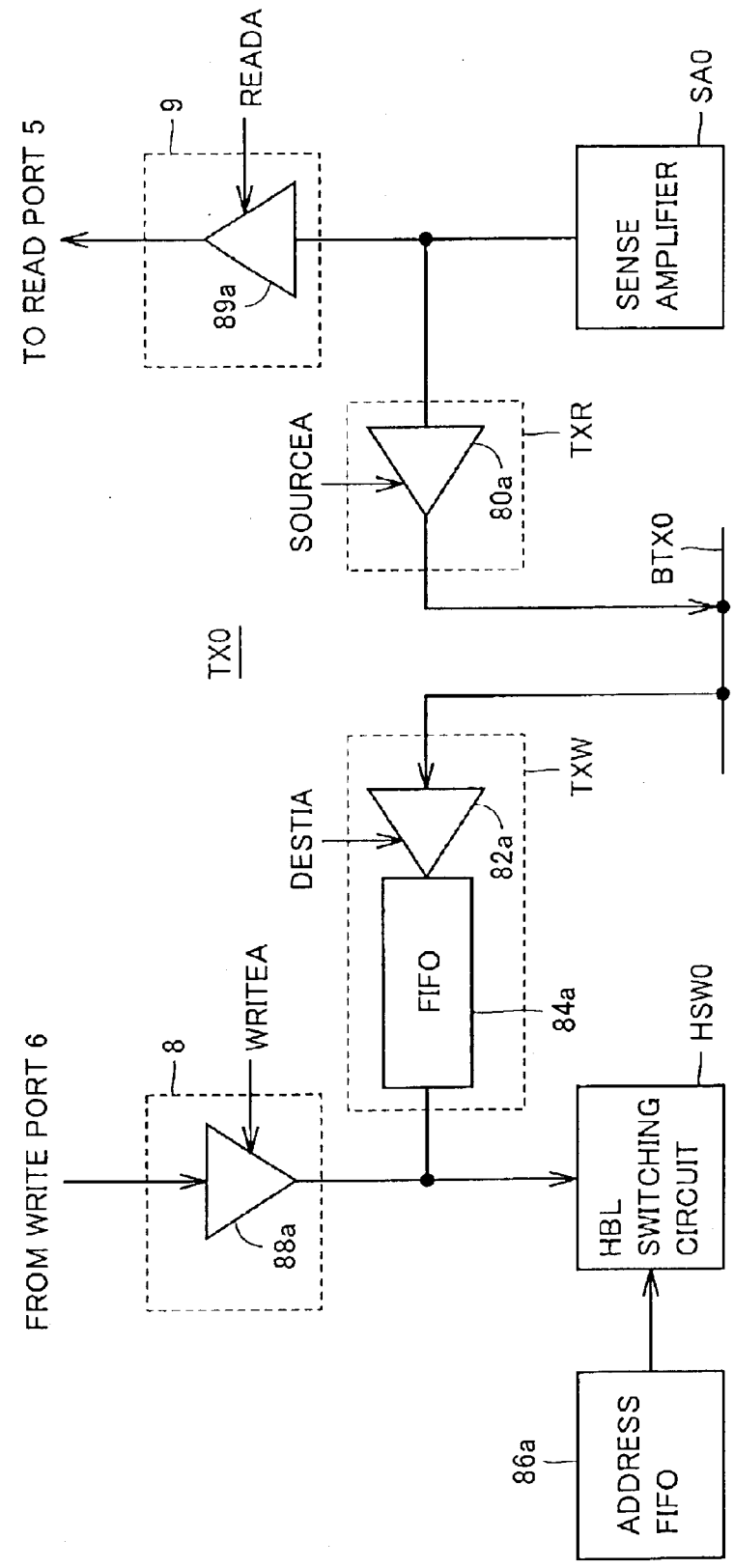
FIG. 18 is a schematic diagram showing a configuration of a transfer switch circuit for a memory block MB0 shown in FIG. 6.

FIG. 18 is a schematic diagram showing an example of a configuration of transfer circuit TX0 provided to a memory block MB0. Transfer switch circuit TX0 includes: a read transfer switch TXR coupled to sense amplifier SA0; and a write transfer switch TXW coupled to HBL switching circuit HSW0.

Read transfer switch TXR includes a tri-state buffer 80$a$ activated in response to activation of data transfer source indication signal SOURCEA and transferring data from sense amplifier SA0 onto bidirectional data transfer line BTX0. Processed data of sense amplifier SA0 is supplied to tri-state buffer circuit 89$a$ included in select circuit 9. Tri-state buffer circuit 89$a$ buffers the output data of sense amplifier SA0 to supply the buffered data to read port 5 in response to activation of read signal READA. Read signal READA is activated when a read command for bank BNKA is supplied. Data transfer source indication signal SOURCEA is activated when data is transferred from banks BNKA to BNKB.

Write transfer switch TXW includes: a tri-state buffer 82$a$ transferring data on bidirectional data transfer line DTX0 in response to activation of data transfer destination indication signal DESTIA; and a first-in first-out (FIFO) 84$a$ sequentially storing output data of tri-state buffer 82$a$. Output data of FIFO 84$a$ is given to HBL switching circuit HSW0. An address FIFO 86$a$ is further provided to HBL switching circuit HSW0. Address FIFO 86$a$ stores addresses of respective data stored in FIFO 84$a$. With FIFO 84$a$ and address FIFO 86$a$, if data writing requires a long time and a period at which transfer data is supplied is different from a period of data writing, transfer data is buffered and then written into a corresponding memory cell. Thereby, internal data transfer can be performed without exerting an adverse influence on an external access even when writing and reading are different in period from each other.

Output data of tri-state buffer circuit 88$a$ of select circuit 8 is also supplied to HBL switching circuit HSW0. Tri-state buffer circuit 88$a$ is activated in response to activation of write signal WRITEA to buffer data received from write port 6 (see FIG. 5) and to transfer the buffered data to HBL switching circuit HSW0. Write signal WRITEA is activated when a write command for bank BNKA is supplied.

Figure 19:
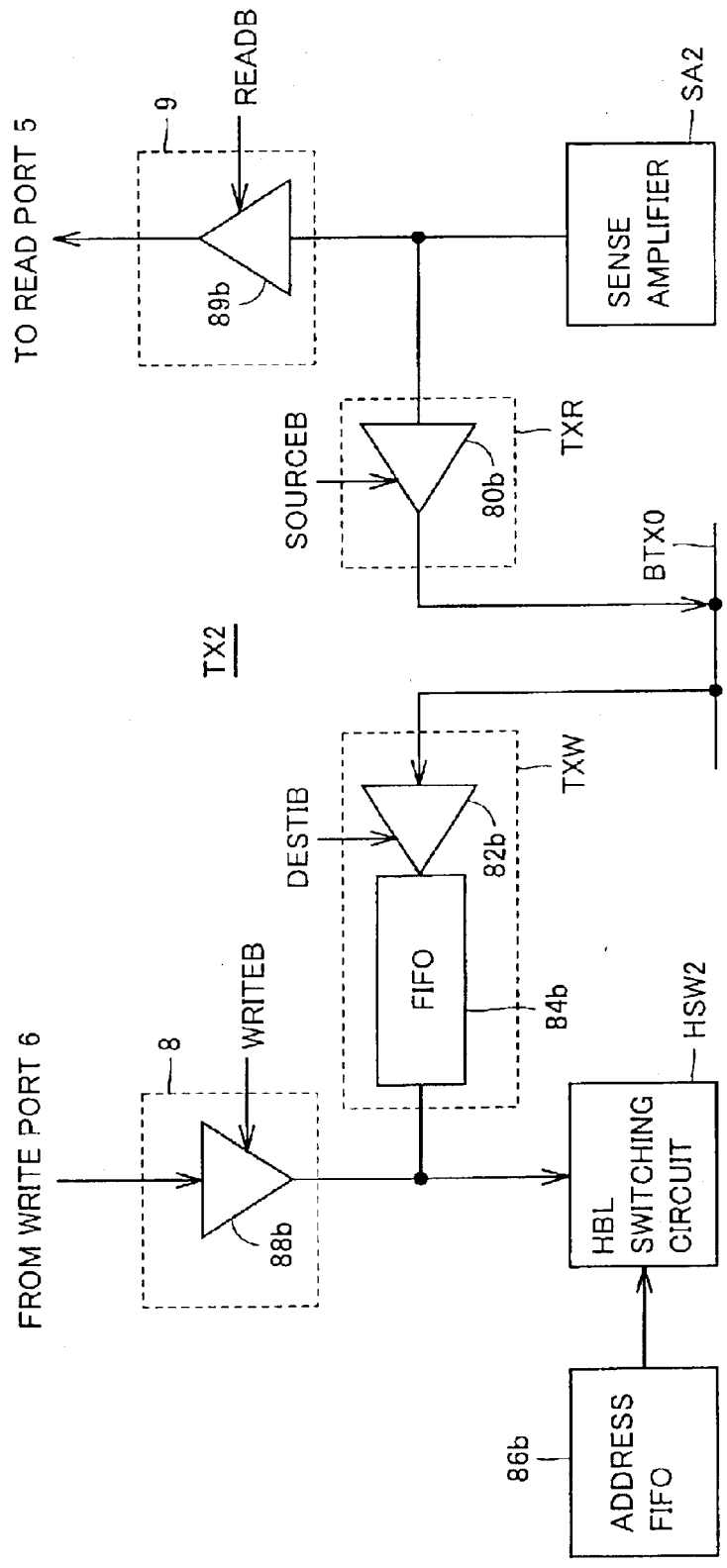
FIG. 19 is a schematic diagram showing a configuration of a transfer switch circuit for a memory block MB2 shown in FIG. 6.

FIG. 19 is a diagram showing a configuration of transfer switch circuit TX2 provided to memory block MB2. In transfer switch circuit TX2, read transfer switch TXR includes a tri-state buffer 80$b$ activated in response to activation of data transfer source indication signal SOURCEB, for buffering output data of sense amplifier SA2 to transfer the buffered data onto bidirectional data transfer line BTX0. Data transfer source indication signal SOURCEB is activated when data is transferred from bank BNKB to BNKA.

Write transfer switch TXW of transfer switch circuit TX2 includes: a tri-state buffer 82$b$ buffering a signal on bidirectional data transfer line BTX0 in response to activation of data transfer destination indication signal DESTIB; and a FIFO 84$b$ sequentially storing output data of tristate buffer 82$b$. Data transfer destination indication signal DESTIB is activated when data transfer is performed to bank BNKB. Address FIFO 86*b* is provided to HBL switching circuit HSW2 in correspondence to FIFO 84*b*, and addresses of storage data of FIFO 84*b* are sequentially applied to HBL switching circuit HSW2.

Sense amplifier SA2 supplies output data thereof to tri-state buffer circuit 89*b* included in select circuit 9. Tri-state buffer circuit 89*b* is activated in response to activation of read signal READB to buffer output data of sense amplifier SA2 to supply the buffered data to read port 5.

Read signal READB is activated when data read operation from bank BNYB is activated. That is, read signal READB is activated when a read command is given to bank BNKB.

HBL switching circuit HSW2 receives output data of tri-state buffer circuit 88*b* included in select circuit 8. Tri-state buffer circuit 88*b* is activated in response to activation of write signal WRITEB to buffer data received from write port 6 and to supply the buffered data to HBL switching circuit HSW2. Write signal WRITEB is activated when a write command for bank BNKB is supplied and further activated when data transfer to and writing of transfer data to bank BNKB are both performed.

In the configuration shown in FIGS. 18 and 19, tri-state buffer circuits 88*a* and 88*b* are included in select circuit 8 coupled to the write port, and tri-state buffer circuits 89*a* and 89*b* are included in select circuit 9 coupled to the read port. Tri-state buffer circuits 88*a* and 88*b* may be provided outside select circuit 8 with select circuit 8 formed of a transmission gate. Likewise, select circuit 9 may be formed of a transmission gate while utilizing tri-state buffer circuits 89*a* and 89*b* as bus drivers.

Read signals READA and READB, data transfer source indication signals SOURCEA and SOURCEB and data transfer destination indication signals DESTIB and DESTIA shown in FIGS. 18 and 19 are generated from main control circuit 7 shown in FIG. 5, and a fundamental configuration of main control circuit 7 is the same as the configuration shown in FIG. 14, and writing and reading of data for a bank and data transfer are controlled by the main control circuit.

Figure 20:
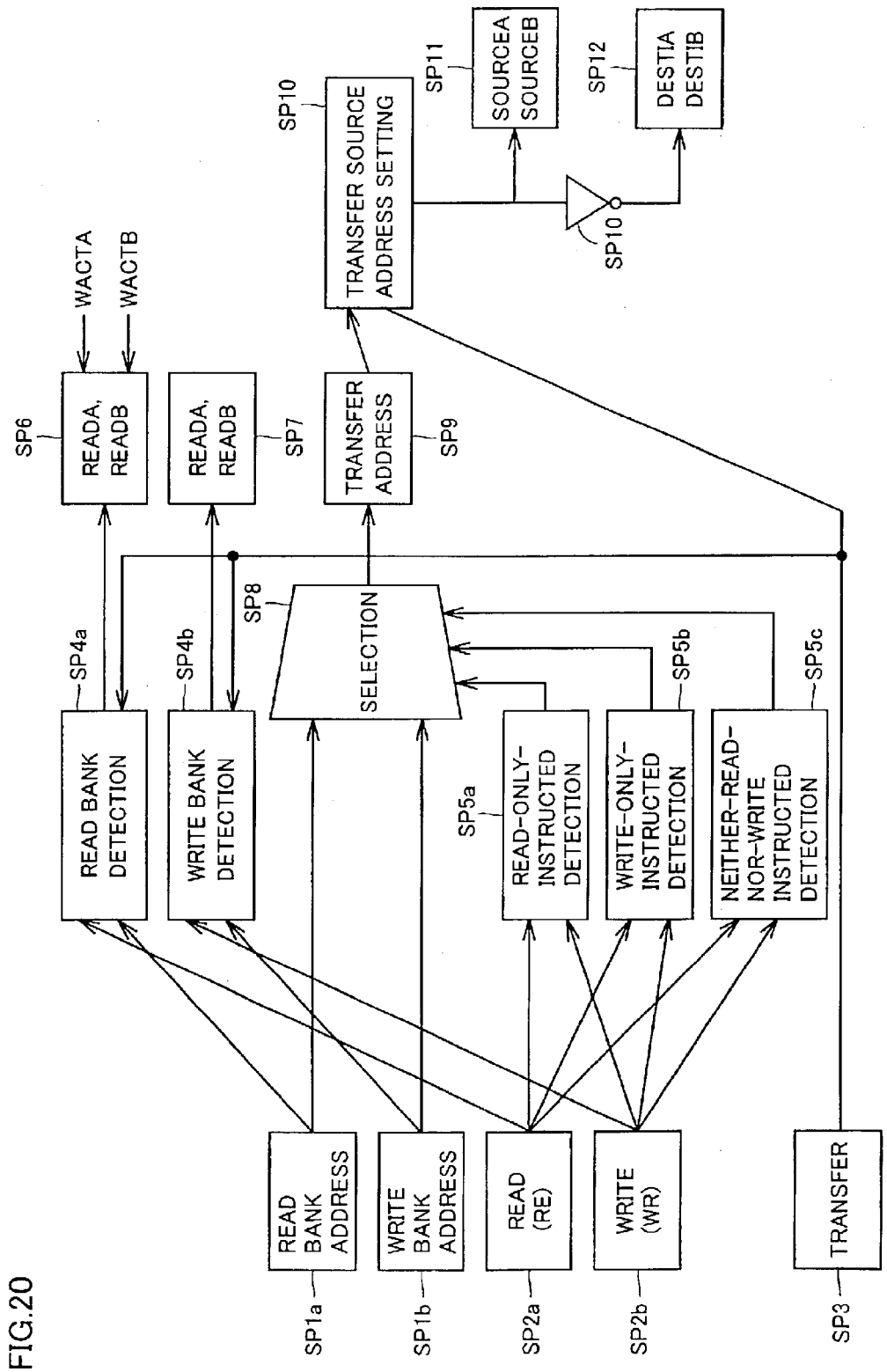
FIG. 20 is a diagram showing contents of a processing for generating transfer control signals shown in FIGS. 18 and 19.

FIG. 20 is a diagram showing contents of a processing in a main control circuit implementing data transfer between banks. The main control circuit (main control circuit 7 shown in FIG. 5) is formed of a processing device such as a controller, and no logic circuit dedicated to each respective processing is employed. Therefore, contents of processings are shown in FIG. 20.

In FIG. 20, the main control circuit performs, when an operating mode instruction is supplied, a read bank address extraction processing SP1*a* and a write bank address extraction processing SP1*b* for extracting a bank address from a read address and a write address externally applied. Furthermore, the main circuit performs, when an operation mode instruction is supplied, performs a read command (RE) extraction processing SP2*a* and a write command (WR) extraction processing SP2*b* in order to detect whether an instructed operation mode is a read mode or a write mode. At the same time, it is detected whether or not a transfer command is supplied according to a command externally supplied (processing SP3).

A read bank for which data reading is performed in accordance with a read bank address and a read command is detected in accordance with results of processings SP1*a* and SP2*a* (processing SP4*a*). A detection processing for a write bank is performed in accordance with a write bank address extracted in processing SP1*a* and a write command WR extracted in processing SP2 (processing SP4*b*). In detection processings SP4*a* and SP4*b*, a transfer source bank and a transfer destination bank, that is, a read bank and a write bank, are set in accordance with a detected command and a bank address when a transfer command is supplied.

When a read bank is detected, read signal READA or READB for a bank to which data reading is designated is activated in accordance with activation/non-activation of bank write activation signals WACTA and WACTB if no access conflict occurs (processing SP6). When writing is possible to a selected bank in accordance with a result of processing SP4*b*, activation of write signal WRITEA or WRITEB for a designated bank (processing SP7) is performed.

In writing, when a selected bank is in a writing state, write data may be stored in data register dedicated to data writing. An address signal is stored in an address FIFO shown in FIGS. 19 and 20. A register dedicated to data may also be commonly used as a FIFO for storing transfer data. An output of tri-state buffer circuit 88*a* and an output of tri-state buffer 82*a* are commonly coupled to FIFO. Likewise, an output of tri-state buffer circuit 88*b* and an output of tri-state buffer 82*b* are commonly coupled to FIFO. Burst write in a normal data writing can be implemented.

On the other hand, the following processings are performed in accordance with results of processings SP2*a* and SP2*b*: a detection processing SP5*a* of detecting whether only a read command is applied; a detection processing SP5*b* of detecting whether only a write command is applied; and a detection processing SP5*c* of detecting no application of both a read command and a write command. A select processing SP8 of selecting a bank address detected in processings SP1*a* and SP1*b* is performed in accordance with the processing results in processings SP5*a* to SP5*c*.

When only a read command is applied, a read bank address is detected in accordance with the processing result in processing SP5*a*. On the other hand, when application of only a write command is detected in processing SP5*b*, a write bank address is selected. When no application of both a read command and a write command is detected, a read bank address is selected. This is because an address of the read address port is set to a transfer source address when an internal transfer is performed in accordance with external specifications. In this case, an address of a transfer destination is set at an address port of the write port.

In accordance with a selection result in a select processing SP8, processing SP9 is performed for setting an address of transfer candidate subject to data transfer as a transfer address. Then, when data transfer is performed according to a processing result in processing SP3, a transfer address set in processing SP9 is set as a transfer source address (processing SP10). When no transfer instruction is applied, a transfer source address is not set and transfer operation is not performed.

When setting a transfer source address is performed in processing SP10, transfer destination indication signals SOURCEA and SOURCEB are selectively activated on the basis of the transfer source address (processing SP11). On the other hand, since there are two banks BNKA and BNKB, by inverting the transfer source address, a transfer destination address is set (processing SP10). A transfer destination bank is set according to processing SP10, and transfer destination indication signal DESTIA or DESTIB is selectively activated according a processing result in processing SP10 (processing SP12).

When it is detected that a transfer command is applied, processing SP4*a* and SP4*b* detect a read bank and a write bank on the basis of processing results in prosessings SP1*a* and SP1*b* regardless of processing results in processings SP2*a* and SP2*b*. When a read command and a transfer command are supplied externally, by setting a bank of a transfer destination at the write address port, the bank of a transfer destination can be detected in write bank detection processing SP4*b*, to activate write signal WRITEA or WRITEB correctly. Furthermore, when only a write command and a transfer command are supplied, likewise, by setting a transfer destination address at the read address port, read bank detection processing SP4*a* is performed in accordance with a processing result in processing SP3, allowing correct detection of a bank of a transfer destination.

When a read command and a transfer command are simultaneously applied, a transfer destination address is set at the write address port. When a write command and a transfer command are applied, a transfer destination address is set at the write address port. With such a procedure, data can be transferred to a desired address region of a bank of a transfer destination. When internal data is transferred for writing or reading to or from the destination bank, internal transfer can also be performed between the same address of banks BNKA and BNKB by setting data and an address only to the write or read port. Brief description will be given of such configuration below.

Figure 21:
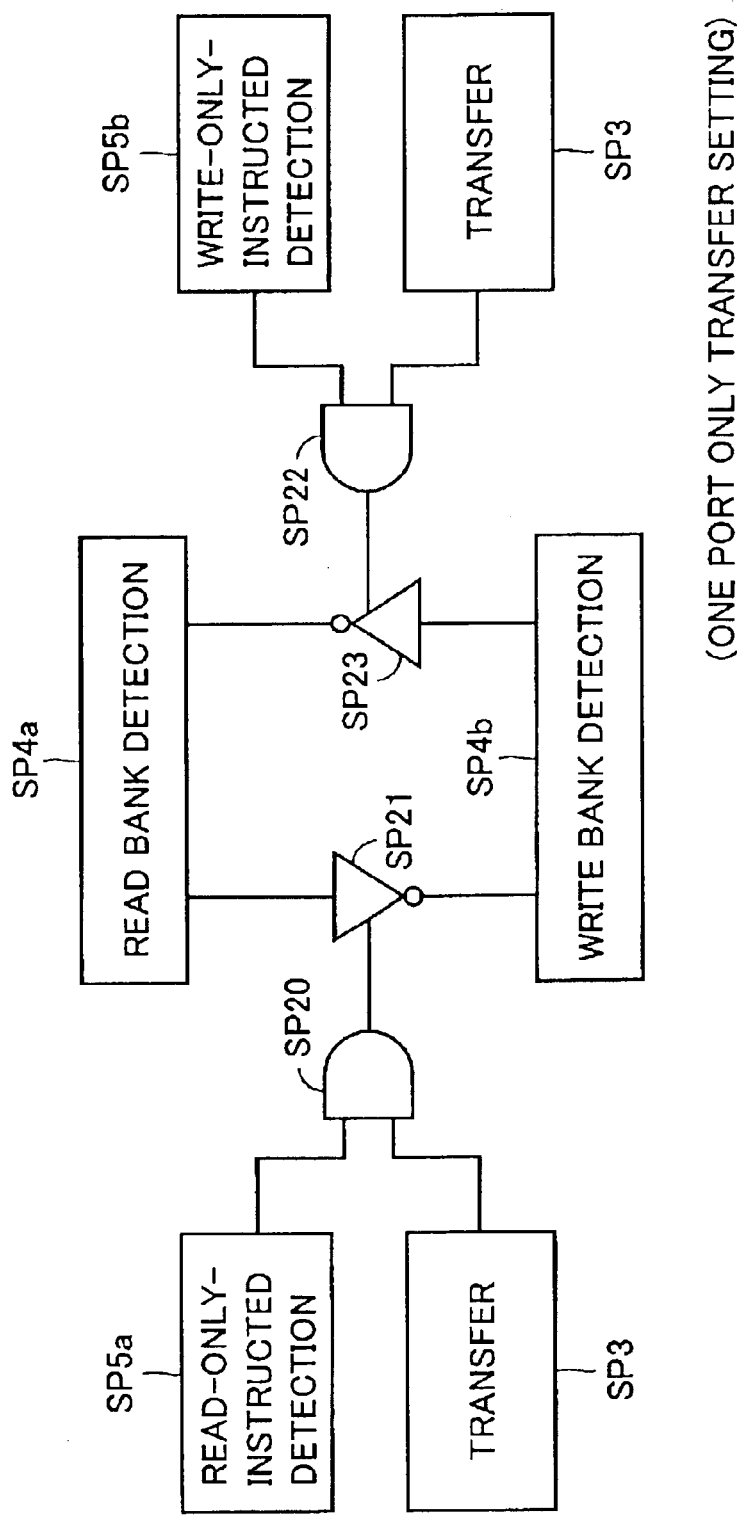
FIG. 21 is a diagram showing an example of a modification of the processing contents shown in FIG. 20.

FIG. 21 is a schematic diagram showing a processing circuit of the main control circuit. In FIG. 21, in addition to a processing sequence shown previously in FIG. 20, there are provided processing SP20 determining that a read command and a transfer command are both applied, in accordance with processing results in processing SP5*a* performing detection of instruction of only read and processing SP3 detecting application of a transfer command; and an inversion processing SP21 inverting a read bank address set by read bank detection processing SP4*a* when a determination result in processing SP20 indicates that a read command and a transfer command are both applied. In this case, in write bank detection processing SP4*b*, a write bank is set on the basis of a processing result in inversion processing SP21.

The main control circuit performs a determination processing SP22 determining whether a write command and a transfer command are both applied in accordance with processing results in processings SP5*b* and SP3, and a processing SP23 inverting a write bank address set by processing SP4*b* when a determination result in determination processing SP22 indicates that a write command and a transfer command are been supplied. In this case, since a read address is not applied to the read port, a read bank is set in read bank detection processing SP4*a* in accordance with a processing result of inversion processing SP23.

Banks are determined being set by read bank detection processing SP4*a* and write bank detection processing SP4*b*, and read signals READA/READB and write signals WRITEA/WRITEB are selectively activated in accordance with processings SP6 and SP7 shown in FIG. 20, to perform writing/reading of data and internal transfer. Thus, in the internal transfer mode, in the write/internal transfer mode and in the read/internal transfer mode, an access can be made only to a bank to be accessed externally using the ports, and the ports to be used in the internal data transfer mode can be unified to facilitate a transfer processing.

Figure 22:
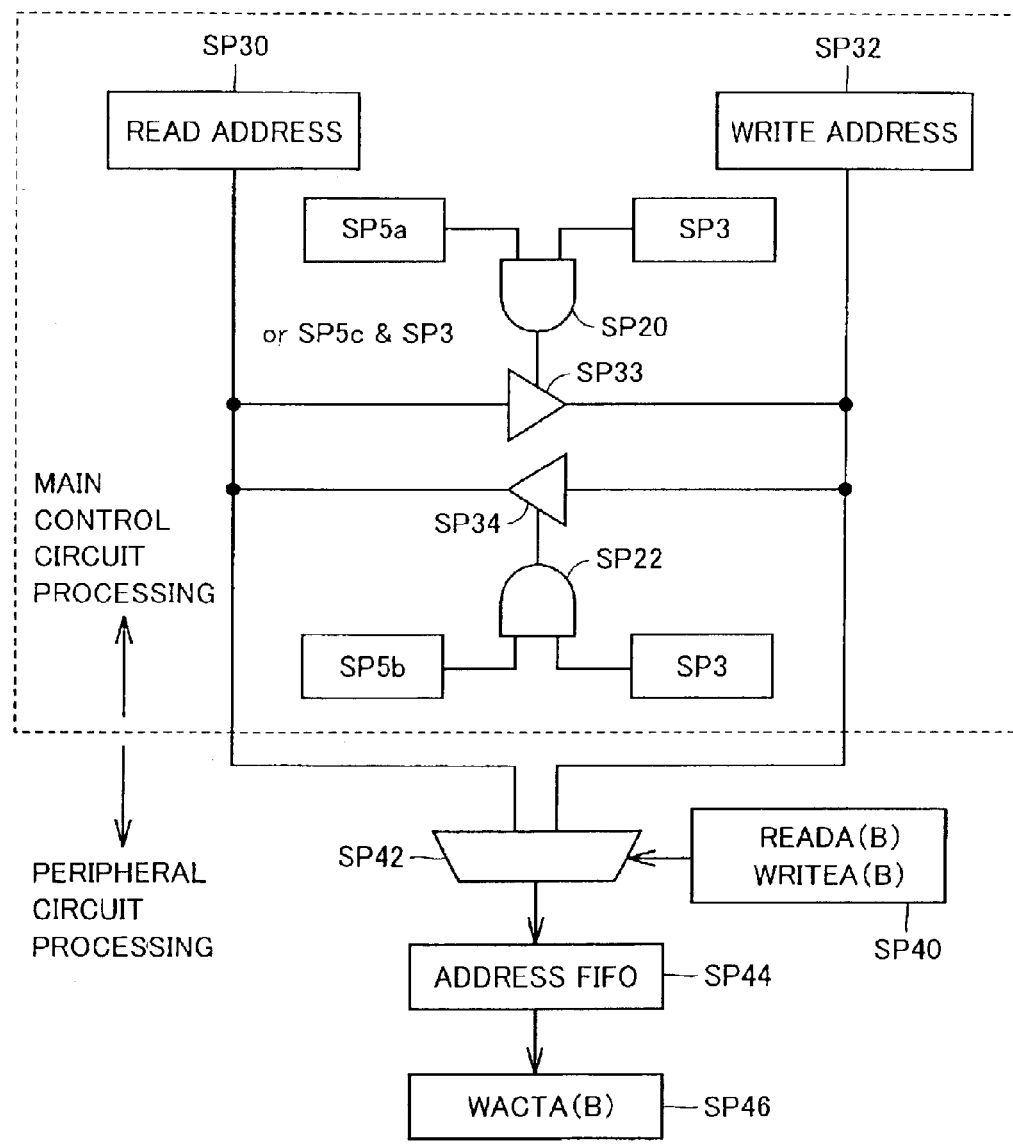
FIG. 22 is a diagram showing a transfer processing on a read address and a write address in the first embodiment of the present invention.

FIG. 22 is a diagram showing a processing of transferring a read address and a write address to banks BNKA and BNKB. In FIG. 22, a processing within a box depicted with a broken line is performed by the main control circuit, whereas a processing outside the box is performed by peripheral circuits of a bank.

In FIG. 22, in the main control circuit, first, a read address detection processing (SP30) and a write address detection processing (SP32) are performed. In processing SP20, it is determined whether a read command only and a transfer command are applied in accordance with processing results in read instruction only detection processing SP5*a* of detecting application of read instruction only and transfer command application detection processing SP3 of detecting application of a transfer command. When it is determined that a read command and a transfer command are applied in determination processing SP20, a read address extracted in processing SP30 is transferred as a write address (processing SP33).

When processing SP3 detects an indication of application of a transfer command in processing SP22 and an indication of application of write command only in processing SP5*b*, a write address detected in processing SP32 is transferred as a read address (processing SP34).

Therefore, in the case of this configuration, a write address and a read address transferred to the banks in a transfer operation are the same address.

When an internal transfer only is instructed without instruction of making a data access, a read bank and a write bank are determined in accordance with the processings shown in FIG. 20.

A processing of selecting an address is performed in peripheral circuits of banks BNKA and BNKB. First, in a processing SP40, it is determined which of a read operation and a write operation is designated. This determination is made by monitoring which of read signal READA (READB) and write signal WRITEA (SRITEB) is active. One of a write address and a read address is selected according to a determination result in processing SP40 (selection processing SP42). Therefore, when read signal READA (READB) is active for a corresponding bank, a read address is selected in processing SP42, while when write signal WRITEA (WRITEB) is active for the corresponding bank, a write address is selected in selection processing SP42. An address selected in selection processing SP42 is sequentially stored into a corresponding address FIFO (processing SP44). Whether there exists an empty address in a corresponding address FIFO is monitored and a control processing for activation/deactivation of write activation signal WACTA (WACTB) is performed (processing SP46).

In application of an internal transfer command, a bank of a transfer source is set by an address at the read port and therefore into a read bank. Therefore, in this case, if a transfer command only is applied and neither a read command nor a write command is applied, the read address is also transferred onto the write address bus in processing SP33. An address transfer processing in processing SP33 is performed by a logical sum operation on processing SP33 and a logical product of processing SP5 and processing SP3.

With these processings, writing/reading can be performed while generating an internal transfer address using an address applied to one port when a read command and a transfer command are applied, when a write command and a transfer command are applied, or when an internal transfer command is applied.

When a read command is applied, a read address is stored into the address FIFO. Address FIFO, however, operates in a first-in, first-out manner and even when only one read address is applied the read address can be read immediately to be applied to corresponding HBL switching circuit HSW As described above, according to the first embodiment of the present invention, internal data transfer can be performed between banks, and a read port and a write port are separately provided to allow a read operation and a write operation to be performed in parallel in the banks.

Furthermore, efficient data transfer can be implemented by a combination with internal data transfer, thereby achieving data storage accommodating for a system application.

Second Embodiment

Figure 23:
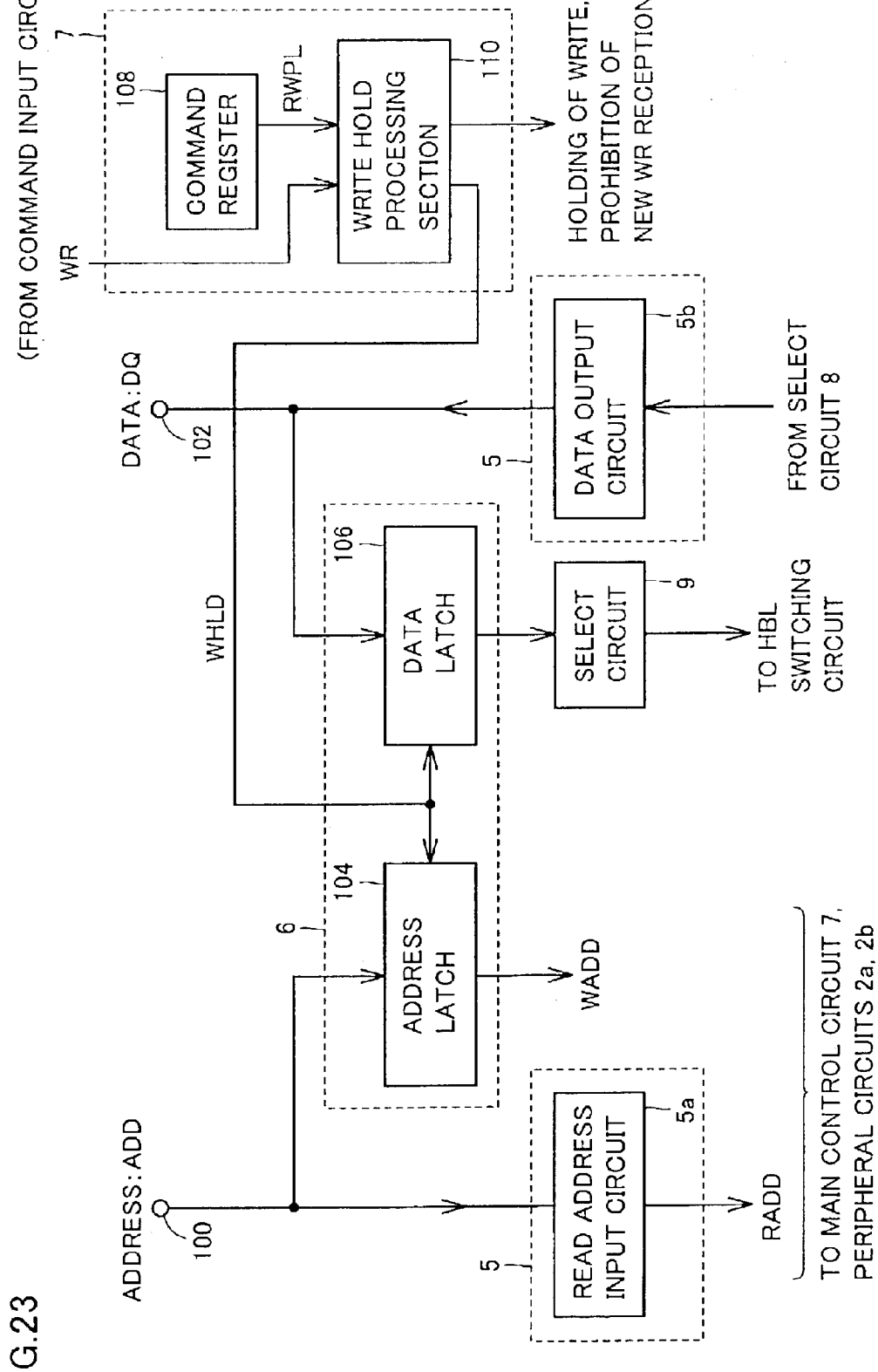
FIG. 23 is a schematic diagram showing a configuration of a main part of a semiconductor memory device according to a second embodiment of the present invention.

FIG. 23 is a schematic diagram showing a configuration of a data and address input section of a nonvolatile semiconductor memory device according to a second embodiment of the present invention. In a configuration shown in FIG. 23, there are provided an address/data input port in common to a read port 5 and a write port 6. Specifically, address signal ADD is applied to an address input port 100 and data DQ is supplied to a data input port 102.

Read port 5 includes: a read address input circuit 5a for taking in an address from address input port 100 in a data read mode, to generate internal read address signal RADD; and a data output circuit 5b for outputting data from select circuit 8 shown in FIG. 6 to data input port 102.

Write port 6 includes: an address latch 104 for taking in and latching an address from address input port 100, to generate internal write address signal WADD when a hold instruction signal WHLD is active; and a data latch 106 for taking in and latching data from data input port 102 to supply latching data to select circuit 9 when hold instruction signal WHLD is active. An address and data related to writing are isolated from an external address bus and an external data bus when address latch 104 and data latch 106 are in a latching state.

In order to set the write port in a latching state, main control circuit 7 is provided with a command register 108 for generating write/read parallel execution instruction RWPL; a write hold processing section 110 generating a hold instruction signal WHLD in accordance with the instruction RWPL from command register 108 and a write operation mode instruction signal (or a write command) WR from a command input circuit. Write hold processing section 110 generates hold instruction signal WHLD when write command WR is supplied while write/read parallel execution instruction RWPL is active. While hold instruction signal WHLD is active, write signal WRITE is maintained active and acceptance of new write command WR is prohibited. Prohibition of new write command WR acceptance is implemented by maintaining write operation mode instruction signal WR forcibly in an inactive state while hold instruction signal WHLD is active or while write signal WRITE is active, in output signals of a command decoder decoding commands from a command input circuit.

Command register 108 has the contents set/reset in accordance with a command register set mode command and a specific address signal bit. Therefore, when command register 108 is utilized, a command for setting write/read parallel execution instruction is applied in a cycle different from cycles where a read command or a write command is applied. However, alternatively, a dedicated command instructing write/read parallel execution instruction may be used as a write command for instructing writing. In that case, command register 108 is not particularly needed. In write hold processing section 110, when a write command with a write/read parallel execution function is supplied, hold instruction signal WHLD is set into an active state. Command register 108 may be set, however, when write command WR with a parallel execution function is supplied. In this case, command register 108 may be configured to be reset when a write operation is completed, or a command for resetting command register 108 may be supplied.

In the case of the configuration shown in FIG. 23, paths related to writing is isolated from an external bus after application of a data write instruction or write command, if data writing requires a longer time as compared with data reading. Therefore, in this case, a read command can be applied in a cycle subsequent to application of a write command, to make a read access to a bank different from a bank under writing.

In the case of the configuration shown in FIG. 23, address input port 100 and data input-output port 102 are commonly provided to the read port and the write port, thereby reducing the number of ports coupled to an external bus and therefore occupation area as compared with a configuration in which an address input port and a data input-output port are provided to each of the read port and the write port individually.

The other parts of the configuration shown in FIG. 23 are the same as those of the configuration shown in FIG. 5, and corresponding components are denoted by the same reference characters. A configuration performing data transfer and data access is the same except for commonization of the read and write ports.

Figure 24:
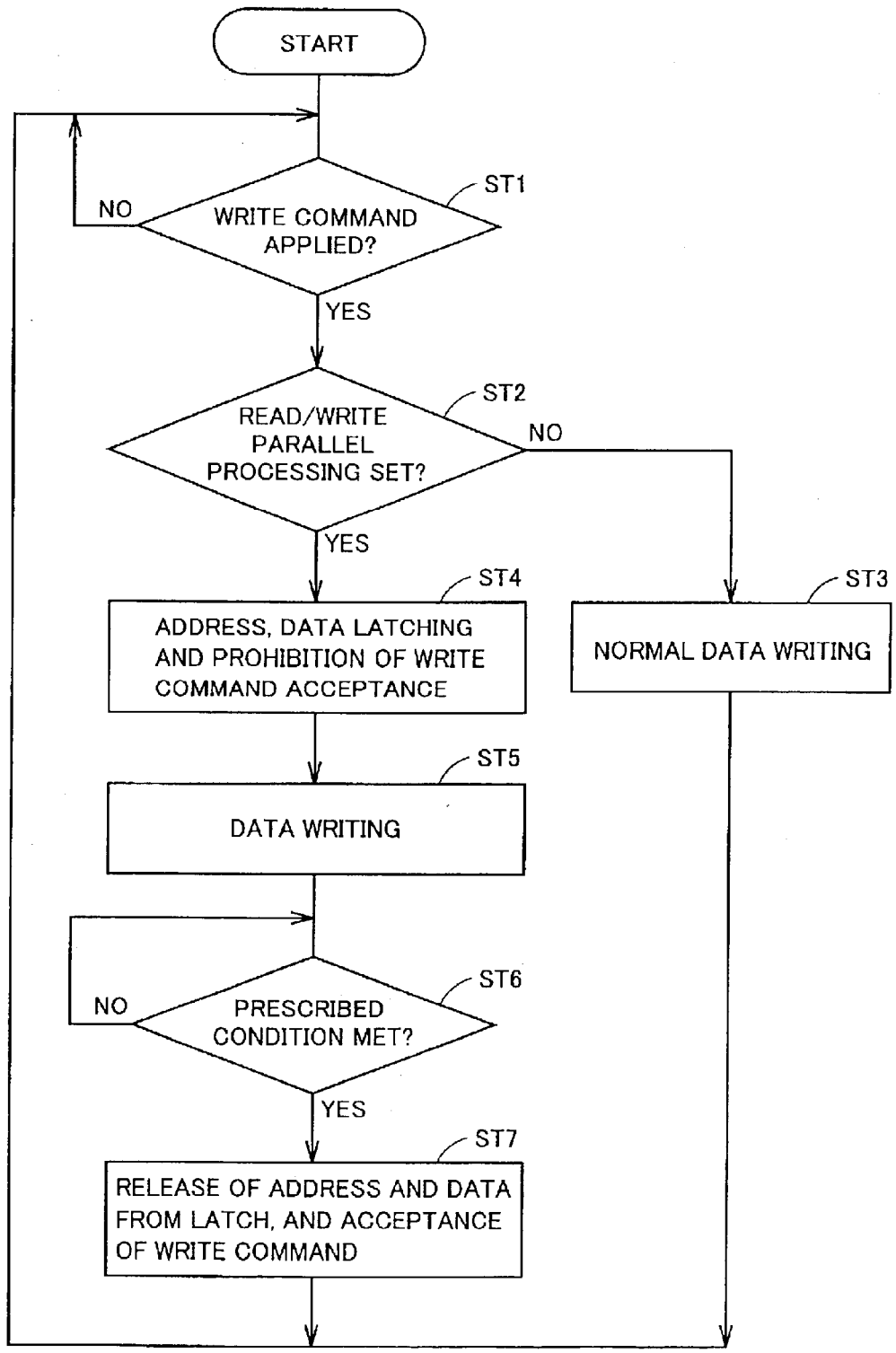
FIG. 24 is a flowchart representing operations in data writing of the configuration shown in FIG. 23.
Figure 25:
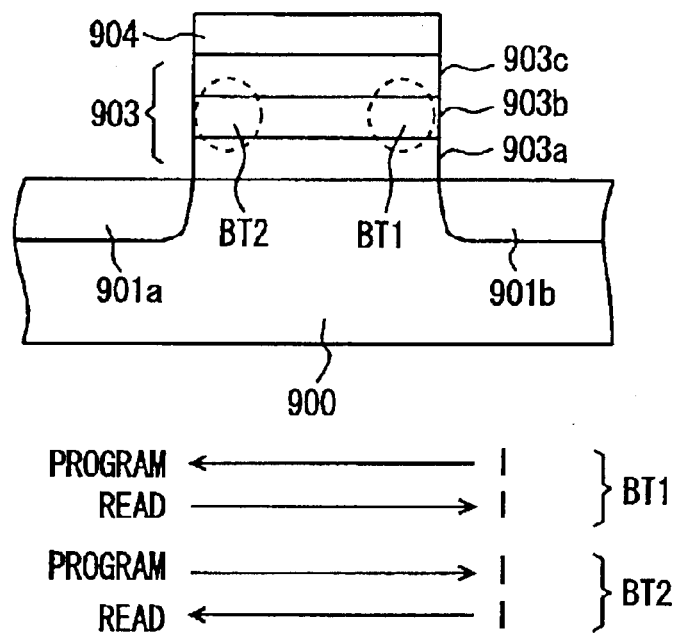
FIG. 25 is a diagram showing a sectional structure of a conventional nonvolatile memory cell and a current flow in programming/reading.
Figure 26:
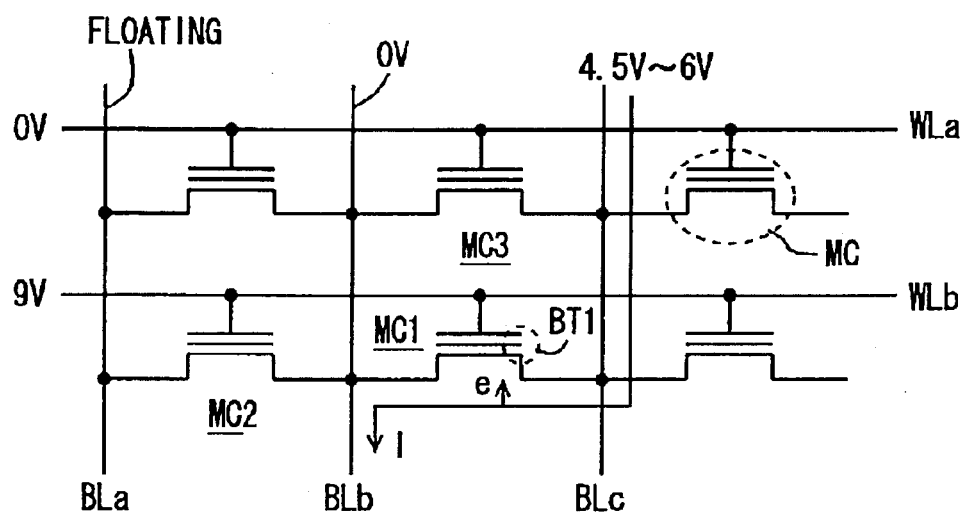
FIG. 26 is a diagram showing applied voltages in a program operation on a conventional nonvolatile memory cell.
Figure 27:
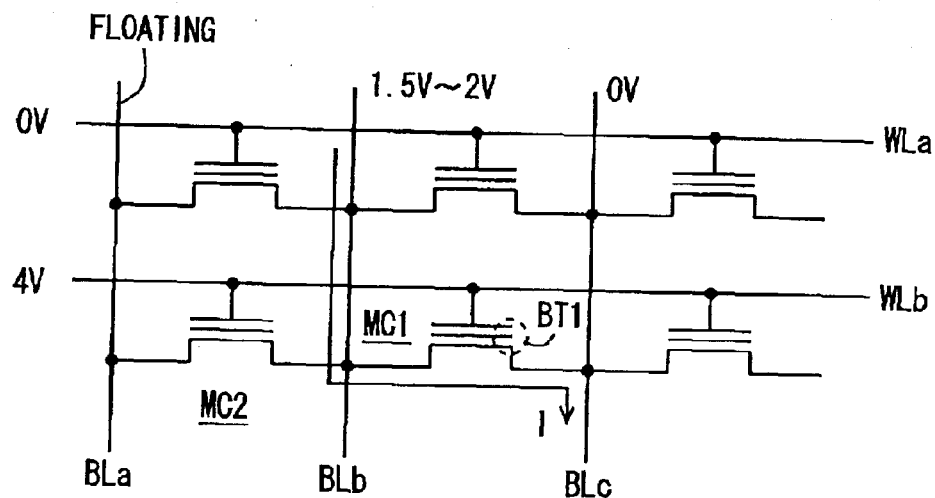
FIG. 27 is a diagram showing applied voltages in data reading on a conventional nonvolatile memory cell.
Figure 28:
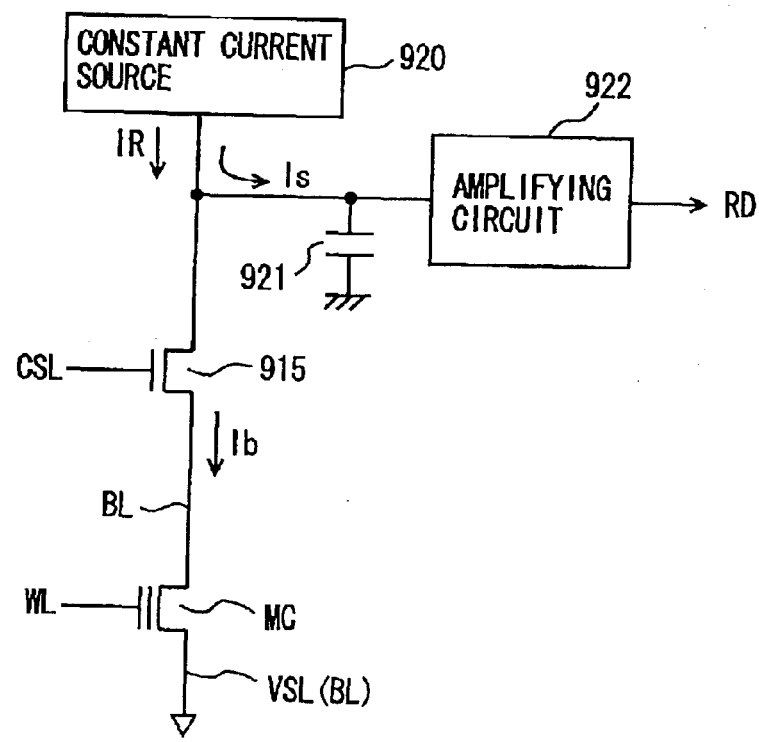
FIG. 28 is a schematic diagram showing a configuration of a data read section of a conventional nonvolatile semiconductor device.

FIG. 24 is a flowchart showing operations of main control circuit 7 in the configuration shown in FIG. 23. Description will be given of operations of main control circuit 7 in the configuration shown in FIG. 23 below with reference to FIG. 24.

First, in main control circuit 7, an output of a command input circuit is monitored and determination is made on whether a write command is applied (step ST1). When an operation mode instruction is applied in the case of no application of a write command, the operating mode instruction is a read command or an internal transfer command and an operation according to a supplied command is performed and application of a write command is monitored.

When a write command is applied, then it is determined whether or not write/read parallel execution instruction is set in command register 108. In this case, when it is required to set the write/read parallel execution in command register 108 prior to application of the write command, write/read parallel execution is designated using a command register mode set command and a specific address bit. In the case of a write command with a parallel execution function, determination on write/read parallel execution instruction is made according to a decoding result of the command.

When no write/read parallel execution processing is designated, no latch signal is generated in write hold processing section 110 and write signal WRITE is activated to perform a normal data write operation (step ST3). At this time, when a data transfer is instructed, internal transfer and writing of data are performed in a similar manner to the first embodiment.

On the other hand, when write/read parallel execution is set in command register 108, or when write/read parallel execution is instructed by a command, write hold processing section 110 sets hold instruction signal WHLD to an active state to set address latch 104 and data latch 106 in a latching state, and causes address latch 104 and data latch 106 to latch an address signal from address input port 100 and data from data input/output port 102, respectively.

Write hold processing section 110 maintains write signal WRITE in an active state in response to activation of hold instruction signal WHLD and prohibits acceptance of a new write command (step S4). Therefore, if hold instruction signal WHLD is set in an active state, no external data cannot be written in a bank (first bank) while a write operation is performed on another bank, even if two banks are internally provided. A read access only can be performed externally on the bank (first bank). Internal data transfer between banks can be performed.

Then, data writing is performed in accordance with an address signal and data stored in address latch 104 and data latch 106 (step ST5). Thereafter, it is determined whether or not a prescribed condition is met in writing (step ST6). This prescribed condition may be any of transition of write activation signal WACT to an inactive state in data writing, elapse of a prescribed clock cycle time and resetting of command register 108. Write port 6 maintains the latching state until the prescribed condition is met in data writing. When the prescribed condition is met, hold instruction signal WHLD from write hold processing section 110 is deactivated and address latch 104 and data latch 106 are released from a latching state (step ST7). Then, new write command WR is permitted to accept.

In a series of processings from step ST1 to ST7, data writing is completed.

Therefore, by isolating a bank on which writing is performed in data writing from an external data bus, a read access can be made to another bank and a high speed processing can be ensured even if an input/output port for an address and data is provided commonly to both of writing and reading.

If a write command with a parallel execution function is exclusively prepared, such an operation sequence can be implemented: write commands are successively supplied to store write data into address FIFO shown in the first embodiment; a write command with a parallel execution processing function is applied as the last write command and a write bank is isolated from an external data bus. Data writing can be efficiently performed in a burst manner, and during the data writing period, reading of data can be performed on another bank. Burst transfer of data can be achieved. Such a configuration may be employed that in burst writing, the number of bits in execution of burst writing is set in command register 108 and the number of data bits is counted in write hold processing section 110, and when the count coincides with a set burst length, hold instruction signal WHLD is set into an active state.

If a latch circuit for latching a write address signal and write data is provided in peripheral circuits of each bank, data writing to banks BNNKA and BNNKB can be alternately performed continuously in a normal write mode. Where data writing is alternately performed on different banks using the latch circuits in data writing, the following configuration is sufficient to use. In a peripheral circuit, that is, HBL switching circuit, there are provided latch circuits latching write address and write data. When main control circuit 7 causes the address latch 104 and data latch 106 to latch new address signal and new data when data writing is instructed on one bank during data writing to another bank. Thereby, in two banks, writing/reading can be performed using the address signal and write data latched in the latch circuits in the peripheral circuits. Data FIFO and address FIFO provided for internal data transfer may be used instead of the latch circuits.

As described above, according to the second embodiment of the present invention, a data writing bank is isolated from an external bus when data writing is performed. Thus, even in a configuration in which an address port and a data port are provided commonly to data writing and to data reading, by supplying a read command in a cycle subsequent to application of a write command, data can be read from another bank, thereby achieving efficient data transfer. Furthermore, an address port and a data port are shared between writing and reading, and layout area of an external bus can be reduced.

As a nonvolatile semiconductor memory device, there is described an insulating film charge trap memory cell trapping charges in an insulating film under the gate. However, as to a nonvolatile memory cell structure, other memory cell structures may be used, such as a phase change memory, ferroelectric memory and magnetic memory.

In an insulating film charge trap memory cell structure, a memory transistor may be any of P-channel transistor and an N-channel transistor.

The case is shown as an example in which two memory blocks are used in one bank. However, the number of memory blocks included in one bank may be three or more. Sense amplifier and HBL switching circuit are provided in correspondence to each memory block to perform writing/reading of data simultaneously in each memory block.

The number of banks can be increased to 3 or more with ease by utilizing a configuration in which a data transfer destination and a data transfer source are designated using both of a read port and a write port.

As described above, according to the present invention, a plurality of memory blocks are provided in one memory bank to perform data access to memory blocks individually, and writing and reading can be performed in parallel in the banks, thereby achieving efficient data transfer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of memory blocks each having a plurality of nonvolatile memory cells;
    a plurality of local buses, provided in correspondence to the respective memory blocks, each for transmitting a voltage for performing writing and reading of data to a corresponding memory block; and
    a data transfer bus commonly provided to said plurality of memory blocks, for transferring data between selected memory blocks of said plurality of memory blocks.

2. The semiconductor memory device according to claim 1, wherein
    each of said plurality of local buses includes a plurality of signal lines,
    in each of said memory blocks, said plurality of memory cells are arranged in rows and columns, and
    each of said memory blocks further includes:
    a plurality of bit lines, provided in correspondence to the memory cell columns, each arranged being shared by memory cells on adjacent columns and connecting to nonvolatile memory cells on corresponding columns; and
    a plurality of word lines provided in correspondence to the respective memory cell rows, and connecting to nonvolatile memory cells on corresponding rows, and
    said semiconductor memory device further comprises:
    voltage supply control circuits provided in correspondence to the memory blocks, each for setting a voltage on a corresponding local bus in accordance with at least an address signal, an operation mode instruction signal and write data at the time of instruction of data writing by said operation mode instruction signal;
    internal read circuits provided in correspondence to the memory blocks, each for detecting data on a selected signal line of the corresponding local data bus in accordance with at least said address signal and generating internal read data; and bit line select circuits provided in correspondence to the memory blocks, each for coupling a signal line of a corresponding local bus to a bit line of a corresponding memory block in accordance with said address signal.

3. The semiconductor memory device according to claim 2, wherein
said data transfer bus is selectively coupled to the voltage control circuit and the internal read circuit of each memory block.

4. The semiconductor memory device according to claim 2, wherein
said plurality of memory blocks are divided into a plurality of memory groups each including at least one memory block, and
the voltage supply control circuits, the internal read circuits and the bit line select circuits are operable independently in units of the memory groups.

5. The semiconductor memory device according to claim 1, further comprising:
a transfer control circuit for generating data of a transfer destination and transfer source determining a data transfer direction in accordance with an operation mode instruction signal and a block address specifying a memory block; and
a data transfer circuit for transferring data between the local buses and said data transfer bus in accordance with said data of the transfer destination and transfer source.

6. The semiconductor memory device according to claim 1, wherein
said plurality of memory blocks are divided into a plurality of memory groups each including at least one memory block, and
said voltage supply control circuits, internal read circuits and bit line select circuits are operable independently in units of memory groups, and
said semiconductor memory device further comprises:
a transfer control circuit for generating data of transfer destination and transfer source determining a data transfer direction in accordance with an operation mode instruction signal and a memory group indication address specifying a memory group; and
a data transfer circuit for transferring data between the local buses and said data transfer bus in units of the memory groups in accordance with said data of transfer destination and transfer source.

7. A semiconductor memory device comprising:
a plurality of memory blocks each including (i) a plurality of nonvolatile memory cells arranged in rows and columns, (ii) a plurality of bit lines, provided in correspondence to the memory cell columns, each arranged being shared by memory cells on adjacent columns and connecting to nonvolatile memory cells on corresponding columns; and (iii) a plurality of word lines, provided in correspondence to the respective memory cell rows, each connecting to nonvolatile memory cells on a corresponding row;
a plurality of local buses provided in correspondence to the respective memory blocks;
a plurality of voltage supply control circuits provided in correspondence to the respective memory blocks and operating independently in units of the memory blocks, each, in operation, for setting a voltage on a corresponding local bus in accordance with at least an address signal, an operation mode instruction signal and write data upon instruction of data writing by said operation mode instruction signal;
a plurality of internal read circuits provided in correspondence to the respective memory blocks and operating individually in units of the memory blocks each, in operation, for detecting data on a selected signal line of a corresponding local data bus in accordance with at least said address signal and generating internal read data; and
a plurality of bit line select circuits provided in correspondence to the respective memory blocks and operating individually in units of the memory blocks, each in operation, for coupling each signal line of a corresponding local bus to a bit line of a corresponding memory block in accordance with said address signal.

8. The semiconductor memory device according to claim 7, further comprising:
a transfer control execution circuit for performing data transfer between selected memory blocks of said plurality of memory blocks in accordance with the address signal and the operation mode instruction signal, said transfer control execution circuit executing control of said data transfer as well as said data transfer in accordance with said operation mode instruction signal in parallel to an external data access to at least one of the selected memory blocks.

9. The semiconductor memory device according to claim 7, further comprising:
a hold circuit for taking in and holding at least a write data and a write address externally applied in accordance with a specific operation mode instruction signal and isolating a holding address and holding write data from an external signal line.

10. The semiconductor memory device according to claim 9, wherein
said hold circuit maintains a holding state until a write operation of said holding write data is completed.

11. The semiconductor memory device according to claim 9, further comprising:
a command hold circuit for holding a write instruction instructing data writing in accordance with said specific operation mode instruction signal, data writing on a selected memory block of said plurality of memory blocks being performed in accordance with said holding address, said holding write data and the write instruction in said command hold circuit.

12. The semiconductor memory device according to claim 11, wherein
said hold circuit and said command hold circuit maintain holding states and prohibit acceptance of a next write instruction until a write operation of said holding write data is completed.

* * * * *